(12) United States Patent
Inoue et al.

(10) Patent No.: US 8,530,891 B2
(45) Date of Patent: Sep. 10, 2013

(54) FIELD-EFFECT TRANSISTOR, AND PROCESS FOR PRODUCING FIELD-EFFECT TRANSISTOR

(75) Inventors: Kazuyoshi Inoue, Chiba (JP); Koki Yano, Chiba (JP); Masashi Kasami, Chiba (JP)

(73) Assignee: Idemitsu Kosan Co., Ltd, Tokyo (JP)

( * ) Notice: Subject to any disclaimer, the term of this patent is extended or adjusted under 35 U.S.C. 154(b) by 766 days.

(21) Appl. No.: 12/594,432

(22) PCT Filed: Feb. 28, 2008

(86) PCT No.: PCT/JP2008/053459
§ 371 (c)(1),
(2), (4) Date: Oct. 2, 2009

(87) PCT Pub. No.: WO2008/126492
PCT Pub. Date: Oct. 23, 2008

(65) Prior Publication Data
US 2010/0117071 A1    May 13, 2010

(30) Foreign Application Priority Data

Apr. 5, 2007 (JP) ................. 2007-099695
Apr. 20, 2007 (JP) ................. 2007-111320

(51) Int. Cl.
*H01L 29/12* (2006.01)
*H01L 31/072* (2012.01)
*H01L 31/109* (2006.01)

(52) U.S. Cl.
USPC ............................. 257/43; 257/192

(58) Field of Classification Search
USPC .............. 257/43, 192–195, E29.247–252
See application file for complete search history.

(56) References Cited

U.S. PATENT DOCUMENTS

| | | | |
|---|---|---|---|
| 7,061,014 B2 * | 6/2006 | Hosono et al. | 257/43 |
| 2003/0218221 A1 | 11/2003 | Wager, III et al. | |
| 2006/0110867 A1 * | 5/2006 | Yabuta et al. | 438/151 |
| 2006/0118844 A1 | 6/2006 | Kijima et al. | |

FOREIGN PATENT DOCUMENTS

| | | |
|---|---|---|
| JP | 2000-44236 A | 2/2000 |
| JP | 2003-298062 A | 10/2003 |
| JP | 2006-502597 A | 1/2006 |
| JP | 2006-165258 A | 6/2006 |
| JP | 2006-165527 A | 6/2006 |
| JP | 2006-165531 A | 6/2006 |

OTHER PUBLICATIONS

International Search Report of PCT/JP2008/053459 (Apr. 22, 2008).
Written Opinion of the International Searching Authority of PCT/JP2008/053459.

* cited by examiner

*Primary Examiner* — Cuong Q Nguyen
(74) *Attorney, Agent, or Firm* — Millen, White, Zelano & Branigan, P.C.

(57) ABSTRACT

To provide a field-effect transistor improved in transparency, electrical properties, stability, uniformity, reproducibility, heat resistance and durability, and as a reduced overlap capacity between electrodes.
A field-effect thin film transistor 1001 includes a gate electrode 1025, an active layer, a source electrode 1022 and a drain electrode 1023, wherein a crystalline oxide 1021 containing indium and having an electron carrier concentration of less than $10^{18}/cm^3$ is used as the active layer, and the gate electrode 1025 is in self-alignment with the source electrode 1022 and the drain electrode 1023. The crystalline oxide 1021 contains a positive trivalent element different from a positive divalent element or indium.

39 Claims, 20 Drawing Sheets

FIELD-EFFECT TRANSISTOR, AND PROCESS FOR PRODUCING FIELD-EFFECT TRANSISTOR

TECHNICAL FIELD

The present invention relates to a field-effect transistor and a method for producing a field-effect transistor. In this field-effect transistor, a crystalline oxide with a predetermined electron carrier concentration is used as an active layer, and a gate electrode is in self-alignment with a source electrode and a drain electrode. In the method for producing a field-effect transistor, a crystalline oxide with a prescribed electron carrier concentration is used as an active layer.

BACKGROUND ART

An active-matrix type display apparatus such as an LCD (liquid crystal display) and an organic EL (Electro Luminescence) display apparatus is widely used in respect of display performance, energy saving, or the like. In particular, the active-matrix type display apparatus has almost come to constitute the mainstream of a display for cellular phones, PDAs (personal digital assistance), PCs, lap-top PCs, TVs or the like. In these display apparatuses, a TFT (field-effect thin film transistor) substrate is normally used For example, a liquid crystal display has a configuration in which a display material such as a liquid crystal is filled between a TFT substrate and an opposing substrate, and a voltage is selectively applied to this display material for each pixel. Here, a TFT substrate means a substrate in which a TFT using, as an active layer, a semiconductor thin film (also referred to as a semiconductor film) such as an amorphous silicon thin film and a polycrystalline silicon thin film is arranged. The above-mentioned image display apparatus is driven by the active matrix circuit of a TFT. Since TFTs are arranged in the shape of an array, a TFT substrate is also referred to as a "TFT array substrate".

Meanwhile, in a TFT substrate used for a liquid crystal display or the like, a set of a TFT and one pixel of the screen of a liquid crystal display (this set is referred to as one unit) are arranged longitudinally and laterally on a glass substrate. In a TFT substrate, a gate wire is arranged longitudinally at equal intervals on a glass substrate, and a source wire or a drain wire are arranged laterally at equal intervals. In addition, a gate electrode, a source electrode, and a drain electrode are respectively formed in the above-mentioned unit which constitutes each pixel.

A transistor using the above-mentioned silicon thin film is produced by using a silane-based gas, and hence, it is disadvantageous in respect of safety or equipment cost. In addition, an amorphous silicon thin film has an electron mobility which is as low as about 0.5 cm$^2$/Vs when used in a TFT. In addition, since an amorphous silicon thin film has a small band gap, it may absorb visible rays to cause malfunction. Moreover, a polycrystalline silicon thin film requires a heating process which is conducted at relatively high temperatures, thereby incurring a large amount of energy cost. In addition, this film is hard to be formed directly on a large-sized glass substrate.

Under such circumstances, a TFT using an oxide semiconductor thin film which can be formed at low temperatures has been actively developed. In addition, with the development of the above-mentioned TFT, development of a semiconductor device using an oxide semiconductor thin film has been actively developed. Further, in order to obtain a flat panel display (Flat Panel Display: FPD) which has a reduced thickness, is light in weight and is resistant to fracture, an attempt has been made to use instead of a glass substrate a resin substrate which is light in weight and flexible.

For example, Patent Document 1 discloses a technology of a thin film transistor using an oxide semiconductor film composed mainly of zinc oxide which is capable of being formed into a film at low temperatures.

Patent Document 2 discloses a technology of a field-effect transistor in which an amorphous oxide containing at least one of In, Zn and Sn is used as an active layer (channel layer), and a gate electrode, a source electrode and a drain electrode.

Patent Document 3 discloses a technology of a transparent conductor material containing an amorphous oxide shown by a general formula $Zn_xM_yIn_zO_{(X+3Y/2+3Z/2)}$ (wherein M is aluminum or gallium).

Patent Document 4 discloses a technology of a method for producing a field-effect transistor including a step of forming an active layer containing an amorphous oxide in an atmosphere which contains at least one selected from ozone gas, a nitrogen oxide gas, oxygen-containing radicals, atomic oxygen, oxygen ions and oxygen radicals.

Patent Document 1: JP-A-2003-298062
Patent Document 2: JP-A-2006-165527
Patent Document 3: JP-A-2000-044236
Patent Document 4: JP-A-2006-165531

DISCLOSURE OF THE INVENTION

Problems to be Solved by the Invention

However, the thin film transistor of Patent Document 1 is required to be improved in transparency, electrical properties as a transistor, or the like.

In the field-effect transistor of Patent Document 2, since an amorphous transparent semiconductor thin film is used as an active layer, there is a possibility that the properties thereof may change greatly with the passage of time or by heat. In addition, the transistor of this patent document suffers from a problem that the threshold voltage thereof may change largely when used for a long period of time. In particular, in the production process, the thermal change of its characteristics when a heat of 300° C. or higher is applied, for example, has become a serious obstacle for industrialization. The reason for such thermal change of the characteristics is assumed to be as follows. The above-mentioned semiconductor thin film has an excessively large number of careers and is amorphous, or oxygen is forced to be contained by increasing the oxygen partial pressure at the time of film forming. As a result, oxygen tends to move easily to cause the career concentration to change easily.

Moreover, an amorphous transparent semiconductor thin film is difficult to be controlled since, in many cases, a large amount of oxygen is introduced at the time of film forming. Therefore, the carrier concentration may change easily with the passage of time or by an environmental temperature. For this reason, it is necessary to control precisely the oxygen partial pressure at the time of film forming. That is, an amorphous transparent semiconductor thin film is too defective to be industrialized in respect of reproducibility, stability or the like.

Further, due to the amorphous nature, an amorphous transparent semiconductor thin film has a poor resistance to chemicals such as an etching solution, the representative example of which is PAN, and hence, it has disadvantages that wet etching of a metal wiring on a semiconductor film cannot be conducted, a refractive index is too large to allow the transmittance of a multilayer film to deteriorate easily. Moreover, due to the amorphous nature, the film adsorbs oxygen, water or the like in an atmospheric gas, and hence, the electric characteristics thereof may change, resulting in a lowered yield.

That is, an amorphous oxide has a problem that the electron career concentration thereof is difficult to be controlled, and it is poor in stability, uniformity, reproducibility, heat resistance and durability.

The transparent conductor material disclosed in Patent Document 3 can preferably be used for a transparent electrode or the like, for example. However, in order to be used as the active layer of a field-effect transistor, the characteristics as a semiconductor are required to be improved. In particular, the on-off ratio is required to be increased. Moreover, due to a small specific resistance, this material has a problem of allowing a transistor to be normally-on.

Further, in order to realize transistor characteristics of a large driving capability, this field-effect transistor has been required to decrease the overlap capacity of a gate electrode, and a source electrode and a drain electrode.

Moreover, since the method for producing a field-effect transistor disclosed in Patent Document 4 has a problem that, since a transparent semiconductor thin film used as an active layer is amorphous, the characteristics thereof may change largely with the passage of time or by heat. In addition, there is a problem that the threshold voltage thereof may change largely when used for a long period of time. In particular, in the production process, the thermal change of its characteristics when a heat of 300° C. or higher is applied, for example, has come to be a serious obstacle for industrialization. The reason for such thermal change of the characteristics is assumed to be as follows. The above-mentioned semiconductor thin film has an excessively large number of careers and is amorphous, or oxygen is forced to be contained by increasing the oxygen partial pressure at the time of film forming. As a result, oxygen tends to move easily to cause the career concentration to change easily.

Further, an amorphous transparent semiconductor thin film is difficult to be controlled since, in many cases, a large amount of oxygen is introduced at the time of film forming. Therefore, the carrier concentration may change easily with the passage of time or by an environmental temperature. For this reason, it is necessary to control precisely the oxygen partial pressure at the time of film forming. That is, an amorphous transparent semiconductor thin film is too defective to be industrialized in respect of reproducibility, stability or the like.

Further, due to the amorphous nature, an amorphous transparent semiconductor thin film has a poor resistance to chemicals such as an etching solution, the representative example of which is PAN, and hence, it has disadvantages that wet etching of a metal wiring on a semiconductor film cannot be conducted, the refractive index is too large to allow the transmittance of a multilayer film to deteriorate easily, or the like. Moreover, due to the amorphous nature, the film adsorbs oxygen, water or the like in an atmospheric gas, and hence, the electrical characteristics thereof may change, resulting in a lowered yield.

That is, an amorphous oxide has a problem that the electron career concentration thereof is difficult to be controlled, and it is poor in stability, uniformity, reproducibility, heat resistance and durability.

The present invention has been made in view of the above-mentioned problems, and an object thereof is to provide a field-effect transistor which is improved in transparency, electric characteristics, stability, uniformity, reproducibility, heat resistance, durability, or the like, and has a reduced overlap capacity between electrodes.

Moreover, the present invention has been made in view of the above-mentioned problem, and another object thereof is to provide a method for producing a field-effect transistor which is improved in transparency, electrical characteristics, stability, uniformity, reproducibility, heat resistance, durability, or the like.

The inventors of the present invention made intensive research and development activities regarding the control of the career concentration in an indium oxide ($In_2O_3$) thin film. As a result, the inventors of the present invention have found that, by adding an oxide of a positive divalent metal to crystalline indium oxide, or by adding an oxide of a positive trivalent metal to crystalline indium oxide, or by adding an oxide of a positive divalent metal and an oxide of a positive trivalent metal to crystalline indium oxide, the electron carrier concentration can be allowed to be less than $10^{18}/cm^3$.

Means for Solving the Problem

In order to attain the above-mentioned object, the field-effect transistor of the present invention comprises a gate electrode, an active layer, a source electrode and a drain electrode, wherein a crystalline oxide containing indium and having an electron carrier concentration of less than $10^{18}/cm^3$ is used as the active layer, and the gate electrode is in self-alignment with the source electrode and the drain electrode.

As mentioned above, by using, as a semiconductor, a crystalline oxide which has characteristics superior to those of an amorphous oxide, the transparency, electrical characteristics, stability, uniformity, reproducibility, heat resistance, durability or the like of a field-effect transistor can be improved. In addition, due to the self-alignment, a parasitic capacity can be reduced, whereby improvement in accuracy and speed of a circuit operation can be realized. Further, since large-area-uniformity is also improved, the image quality of a large-sized image display apparatus can be improved.

Moreover, it is preferred that the above-mentioned crystalline oxide contain a positive divalent element.

Presence of a positive divalent element has an effect of extinguishing careers which are produced by oxygen deficiency, and hence, can reduce the electric career concentration.

Although being lower than the electron mobility of a thin film formed of a mono-crystalline oxide, a thin film formed of a polycrystalline oxide can have a large degree of electron mobility.

Further, in the case of a thin film formed of a crystalline oxide, oxygen is fixed in a more stabilized manner. Moreover, the field-effect mobility of this thin film is high, and the composition range for a crystalline oxide can be expanded.

Further, it is preferred that the above-mentioned positive divalent element be at least one element selected from Zn, Mg, Ni, Co and Cu.

In this way, indium is solution-substituted by at least part of the positive divalent elements such as zinc. As a result, the electron career concentration can be effectively reduced.

Further, it is preferred that the electron mobility of the crystalline oxide logarithmically proportionally increase in a certain range with an increase in the electron carrier concentration, when the atomic ratio ([M2]/[A]) of the number of the atoms of the positive divalent element ([M2]) to the number of the atoms of all metal elements contained in the crystalline oxide ([A]) changes.

In this way, not only semiconductor properties can be set easily but also the added value of a semiconductor can be improved.

Further, it is preferred that the above-mentioned crystalline oxide contain a positive trivalent element which is different from the above-mentioned indium.

This has an effect of suppressing generation of oxygen deficiency. In addition, if a positive divalent element and a positive trivalent element are used simultaneously, career generation can be suppressed more effectively.

Although being lower than the electron mobility of a thin film formed of a mono-crystalline oxide, a thin film formed of a polycrystalline oxide can have a large degree of electron mobility.

Further, in the case of a thin film formed of a crystalline oxide, oxygen is fixed in a more stabilized manner, and the composition range for a stable crystalline oxide can be expanded.

Further, it is preferred that the above-mentioned positive trivalent element be at least one elements selected from B, Al, Ga, Sc, Y and a lanthanoid element.

In this way, the crystalline oxide is effectively stabilized by the strong ionic bonding property of B, Al, Ga, Sc, Y, and a lanthanoid element.

Examples of the lanthanoid element include La, Nd, Sm, Eu, Gd, Dy, Ho, Er, Tm, Yb and Lu.

Further, it is preferred that the electron mobility of the crystalline oxide logarithmically proportionally increase in a certain range with an increase in electron carrier concentration, when the atomic ratio ([M3]/[A]) of the atom number of the positive trivalent element ([M3]) to the atom number of all metal elements contained in the crystalline oxide ([A]) changes.

In this way, not only semiconductor properties can be set easily but also the added value of a semiconductor can be improved.

Further, it is preferred that the above-mentioned crystalline oxide be a nondegenerate semiconductor.

In this way, the off-current can be rendered small and the on/off ratio can be increased. Here, the nondegenerate semiconductor refers to a semiconductor which shows non-degenerating conduction. The non-degenerating conduction means the state in which thermal activation energy regarding the temperature-dependent electric resistance is 30 meV or more.

Further, it is preferred that the above-mentioned crystalline oxide be resistant to PAN. Due to the PAN resistance, the degree of freedom of the production process is increased, whereby the semiconductor device can be produced efficiently.

Moreover, it is preferred that the field-effect transistor be a top-gate type transistor, and it is preferred that the gate electrode be formed using the pattern of the source electrode and the drain electrode formed on a transparent electrode.

In this way, self-alignment becomes possible and parasitic capacity can be reduced, whereby improvement in accuracy and speed of a circuit operation can be realized.

Further, it is preferred that the field-effect transistor be a bottom-gate type transistor and the source electrode and the drain electrode be formed using the pattern of the gate electrode formed on a transparent substrate as a mask.

In this way, self-alignment becomes possible and the parasitic capacity can be reduced, whereby improvement in accuracy and speed of a circuit operation can be realized.

In order to attain the above-mentioned object, the method for producing a thin film transistor according to the present invention is a method for producing a field-effect transistor using a crystalline indium-containing oxide with an electron carrier concentration of less than $10^{18}/cm^3$ as an active layer, comprising, the active layer forming step of forming the crystalline oxide in an atmosphere containing oxygen and/or water.

In this way, when forming an active layer, an oxide is crystallized to be a crystalline oxide. Therefore, for example, in the post treatment, a dedicative crystallization process is not necessarily provided, whereby productivity can be improved. Moreover, a crystalline oxide which has properties superior to those of an amorphous oxide is used as a semiconductor. As a result, the transparency, electrical characteristics, stability, uniformity, reproducibility, heat resistance, durability, or the like of a field-effect transistor can be improved.

Further, it is preferred that the atmosphere containing oxygen and/or water contain at least one of molecular oxygen, ozone gas, nitrogen oxide gas, oxygen-containing radicals, atomic oxygen, oxygen ions, oxygen radicals, water vapor and hydroxide ions.

In this way, since generation of oxygen deficiency can be effectively suppressed, the number of carriers generated by oxygen deficiency is reduced, whereby the electron carrier concentration can be reduced.

Further, it is preferred that the film forming temperature of the above-mentioned crystalline material oxide be 150° C. or more and 350° C. or less.

With this temperature range, a crystalline oxide can be formed without fail. In addition, thermal deformation or the like of a substrate can be suppressed.

Further, it is preferred that the sputtering method be used in the active layer-forming step. In this way, mass productivity can be improved.

In order to attain the above-mentioned object, the method for producing a field-effect transistor of the present invention is a method using a crystalline indium-containing oxide with an electron carrier concentration of less than $10^{18}/cm^3$ as an active layer, comprising, the thin film forming step of forming an amorphous oxide film for the active layer, and the crystallizing step of crystallizing the amorphous oxide to the crystalline oxide.

In this way, the degree of freedom in the process design can be increased. That is, since an amorphous oxide is soluble in a PAN-based etching solution or an oxalic acid-based etching solution, it can be simultaneously etched together with a metal layer, or the like. Moreover, if an amorphous oxide is crystallized, this crystallized oxide is no longer dissolved in a PAN-based etching solution or an oxalic acid-based etching solution. Therefore, productivity can be improved by combining half-tone exposure and selective etching.

Further, it is preferred that the crystallizing step use heating and/or irradiation of an oxygen-containing plasma.

In this way, the oxide is crystallized easily to become a crystalline oxide.

Further, it is preferred that a heat treatment be conducted in the crystallizing step and that the temperature of the heat treatment be 150° C. or more and 350° C. or less.

In this way, a crystalline oxide can be formed without fail. Further, thermal deformation or the like of a substrate or the like can be suppressed.

Further, it is preferred that at least one of the thin film forming step and the crystallizing step be conducted in an atmosphere containing oxygen and/or water, and the atmosphere containing oxygen and/or water contains at least one of molecular oxygen, ozone gas, nitrogen oxide gas, oxygen-containing radicals, atomic oxygen, oxygen ions, oxygen radicals, water vapor and hydroxide ions.

In this way, generation of oxygen deficiency can be suppressed effectively. Therefore, the number of careers generated by oxygen deficiency can be decreased, whereby the electron career concentration can be reduced.

Further, it is preferred that the sputtering method be used in the thin film forming step.

In this way, mass productivity can be improved.

Further, it is preferred that the crystalline oxide contain a positive divalent element. Presence of a positive divalent element has an effect of extinguishing careers which are produced by oxygen deficiency, and hence, can reduce the electron career concentration.

Although being lower than the electron mobility of a thin film formed of a mono-crystalline oxide, a thin film formed of a polycrystalline oxide can have a large degree of electron mobility.

Further, in the case of a thin film formed of a crystalline oxide, oxygen is fixed in a more stabilized manner. Moreover, the field-effect mobility of this thin film is high, and the composition range for a stable crystalline oxide can be enlarged.

Further, it is preferred that the positive divalent element be at least one element selected from Zn, Mg, Ni, Co and Cu.

In this way, indium is solid-solution-substituted by at least part of the positive divalent elements such as zinc. As a result, the electron career concentration can be effectively reduced.

Further, it is preferred that the crystalline oxide be a crystalline oxide in which the electron mobility of the crystalline oxide logarithmically proportionally increases in a certain range with an increase in the electron carrier concentration, when the atomic ratio ([M2]/[A]) of the number of the atoms of the positive divalent element ([M2]) to the number of the atoms of all metal elements contained in the crystalline oxide ([A]) changes.

In this way, not only semiconductor properties can be set easily but also the added value of a semiconductor can be improved.

Further, it is preferred that the crystalline oxide contain a positive trivalent element different from the above-mentioned indium.

Presence of such a positive trivalent element has an effect of suppressing generation of oxygen deficiency. Carrier generation can be suppressed further effectively by simultaneously using a positive divalent element and a positive trivalent element.

Although being lower than the electron mobility of a thin film formed of a mono-crystalline oxide, a thin film formed of a polycrystalline oxide can have a large degree of electron mobility.

Further, in the case of a thin film formed of a crystalline oxide, oxygen is fixed in a more stabilized manner. Moreover, the field-effect mobility of this thin film is high, and the composition range for a stable crystalline oxide can be expanded.

Further, it is preferred that the positive trivalent element be at least one element selected from B, Al, Ga, Sc, Y and a lanthanoid element.

In this way, the crystalline oxide is effectively stabilized by the strong ionic bonding property of B, Al, Ga, Sc, Y, and a lanthanoid element.

Examples of the lanthanoid element include La, Nd, Sm, Eu, Gd, Dy, Ho, Er, Tm, Yb and Lu.

It is preferred the crystalline oxide be a crystalline oxide in which the electron mobility of the crystalline oxide logarithmically proportionally increases in a certain range with an increase in the electron carrier concentration, when the atomic ratio ([M3]/[A]) of the number of the atoms of the positive trivalent element ([M3]) to the number of the atoms of all metal elements contained in the crystalline oxide ([A]) changes.

In this way, not only semiconductor properties can be set easily but also the added value of a semiconductor can be improved.

Further, it is preferred that a substrate on which the active layer is to be formed is subjected to at least one treatment of ultraviolet irradiation in an ozone atmosphere, plasma irradiation and cleaning with a cleaning solution containing hydrogen peroxide.

By such a treatment, impurities adhering to the surface of the substrate can be removed, whereby the substrate surface becomes clean.

Further, it is preferred that the above-mentioned crystalline oxide be a nondegenerate semiconductor.

In this way, the off-current can be rendered small and the on/off ratio can be increased.

Here, the nondegenerate semiconductor refers to a semiconductor which shows non-degenerating conduction. The non-degenerating conduction means the state in which thermal activation energy regarding the temperature-dependent electric resistance is 30 meV or more.

Further, it is preferred that the above-mentioned crystalline oxide have a PAN resistance.

Due to the PAN resistance, the degree of freedom of the production process is increased, whereby the semiconductor device can be produced efficiently.

BEST MODE FOR CARRYING OUT THE INVENTION

[One Embodiment of Field-effect Transistor]

Figure 1:
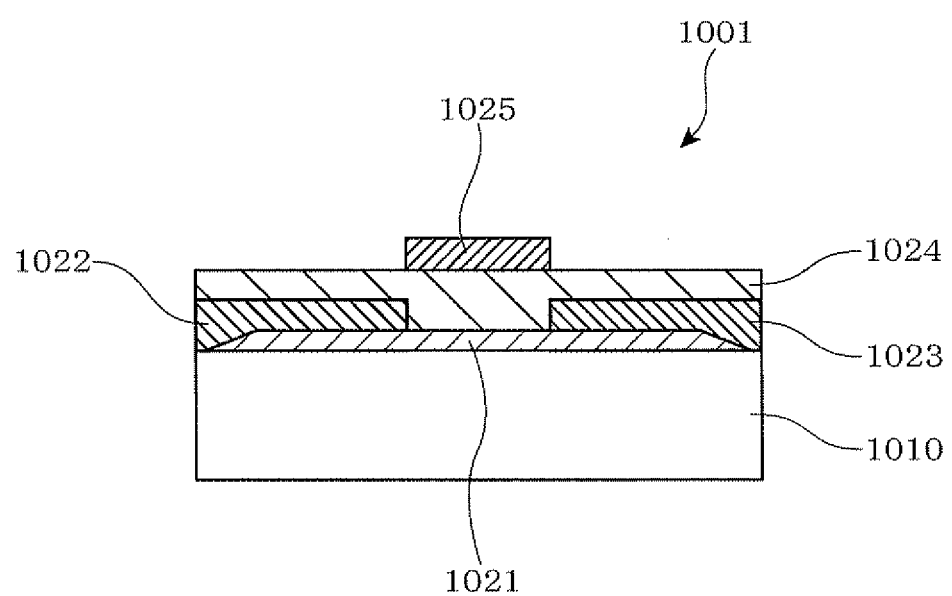
FIG. 1 is a schematic cross-sectional view of the essential parts of a field-effect thin film transistor according to one embodiment of the present invention.

FIG. 1 is a schematic sectional view showing essential parts of a field-effect thin film transistor according to one embodiment of the invention.

In FIG. 1, the field-effect thin film transistor 1001 (abbreviated as TFT 1001) is of top-gate type. The TFT 1001 has a crystalline oxide 1021, a source electrode 1022, a drain electrode 1023, a gate-insulating film 1024 and a gate electrode 1025.

The crystalline oxide 1021 is an active layer and formed on a transparent glass substrate 1010. The source electrode 1022 and drain electrode 1023 are formed apart from each other on the crystalline oxide 1021 and glass substrate 1010. The gate-insulating film 1024 is formed on the crystalline oxide 1021, source electrode 1022 and drain electrode 1023. The gate electrode 1025 is formed on the gate-insulating film 1024 above the crystalline oxide 1021.

The TFT 1001 is not limited to the above top-gate type TFT and may be variously structured TFTs such as a bottom-gate type TFT. The substrate on which the TFT 1001 is formed is not limited to the glass substrate 1010 and may be a transparent resin substrate, a transparent flexible resin film or the like.

The field-effect thin film transistor 1001 of the embodiment uses, as an active layer, the crystalline oxide 1021 with an electron carrier concentration of less than $10^{18}/CM^3$ which contains indium. The gate electrode 1025 of TFT 1001 is formed by self-alignment using the source electrode 1022 and drain electrode 1023.

Next, the self alignment will be described referring to the drawing.

Figure 2:
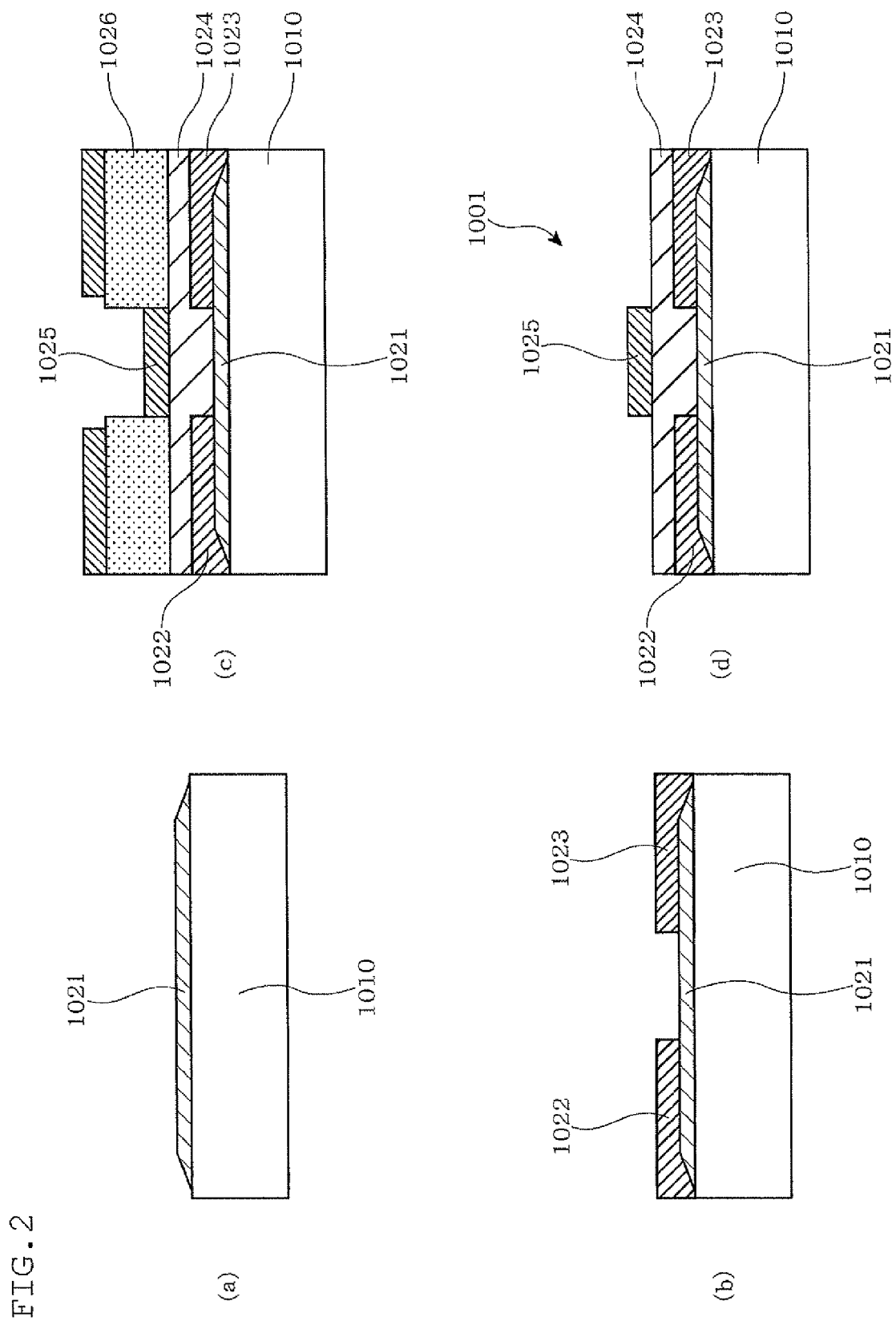
FIG. 2 is a schematic view, for explaining self-alignment, of essential parts of a field-effect thin film transistor according to one embodiment of the present invention, in which (a) is a cross-sectional view showing the state in which a crystalline oxide is formed, (b) is a cross-sectional view showing the state in which a source electrode and a drain electrode are formed, (c) is a cross-sectional view showing the state in which a gate-insulating film, a resist and a gate electrode are stacked, and (d) is a cross-sectional view showing the state in which the gate electrode is formed.

FIG. 2 is a schematic view, for explaining self-alignment, of essential parts of a field-effect thin film transistor according to one embodiment of the present invention, in which (a) is a cross-sectional view showing the state in which a crystalline oxide is formed, (b) is a cross-sectional view showing the state in which a source electrode and a drain electrode are formed, (c) is a cross-sectional view showing the state in which a gate-insulating film, a resist and a gate electrode are stacked, and (d) is a cross-sectional view showing the state in which the gate electrode is formed.

First, as shown in FIG. 2(a), in a field-effect thin film transistor 1001, a transparent amorphous indium oxide thin film is deposited on a transparent glass substrate 1010 by sputtering and the like (using a target containing 5 wt % of zinc oxide and 95 wt % of indium oxide), and patterned, followed by a heat treatment in the air at 300° C. for one hour. The treatment causes the amorphous indium oxide thin film to change to a crystalline oxide 1021 (crystalline indium oxide thin film).

Next, as shown in FIG. 2(b), an IZO film with a high electric conductivity is deposited on the glass substrate 1010 and crystalline oxide 1021 (using a target containing 10.7 wt % of zinc oxide and 89.3 wt % of indium oxide). A Mo/Al/Mo thin film for a source electrode 1022 and a drain electrode 1023 is deposited. The Mo/Al/Mo and IZO film with the high electric conductivity are patterned to be a source electrode 1022 and drain electrode 1023. In the drawing, the Mo/Al/Mo thin film is not distinguished from the IZO film.

Both the Mo/Al/Mo thin film and IZO film are patterned with an aqueous solution of phosphoric acid, acetic acid and nitric acid (hereinafter, appropriately abbreviated as PAN). Since the crystalline oxide 1021 has a resistance against PAN, the source electrode 1022 and drain electrode 1023 can selectively be formed.

As shown in FIG. 2(c), a light-transmitting gate-insulating film 1024 is deposited on the glass substrate 1010 and crystalline oxide 1021 and then a positive resist film 1026 is applied. The film 1024 is made of an oxide such as $Y_2O_3$, $HfO_2$, $SiO_2$, $SiN_x$ and $Al_2O_3$, a mixture of two or more thereof or the like.

If any defect presents at the interface between the gate-insulating film 1024 and crystalline oxide 1021 (active layer), the electron mobility lowers and hysteresis occurs in transistor properties. A leak current greatly changes depending on the type of gate-insulating film 1024. Thus, a gate-insulating film 1024 suitable for an active layer is required to be selected. If using an $Al_2O_3$ film, a leak current can be reduced. If using an $SiO_2$ film, a hysteresis can be reduced. If using an SiNx film with a high dielectric constant, the field-effect mobility can be higher. Using a film of mixture thereof, a TFT with a small leak current and hysteresis and a high field-effect mobility can be formed. Since the formation of gate-insulating film 1024 and crystalline oxide 1021 can be conducted at room temperature, an either TFT of top-gate type or bottom-gate type can be formed.

Next, the positive resist film 1026 is irradiated with light such as g rays with a wavelength of 436 nm or i rays with a wavelength of 365 nm from on the substrate side (from below the glass substrate 1010 in the drawing) using the source electrode 1022 and drain electrode 1023 as masks.

The glass substrate 1010 is transparent, the source electrode 1022 and drain electrode 1023 block light, and the gate-insulating film 1024 is transparent. The absorption edge of crystalline oxide 1021 is about 3.7 eV. Thus, the positive resist film 1026 is exposed to light with a weaker energy than this, that is, light with a longer wavelength. Since the crystalline oxide 1021 hardly absorbs light with the above wavelength range, the semiconductor layer (crystalline oxide 1021) is not damaged by light irradiation.

When the positive resist film 1026 is developed, the non-exposed parts thereof corresponding to the pattern of source electrode 1022 and drain electrode 1023 remain and the exposed parts are removed. The edges of the remaining positive resist film 1026 defining a gate electrode 1025 coincide with the edges of the source electrode 1022 and drain electrode 1023 previously formed. That is, the gate electrode 1025 is formed using the source electrode 1022 and drain electrode 1023 as mask patterns.

Thereafter, a metal thin film for a gate electrode 1025 is deposited on the positive resist film 1026 and gate-insulating film 1024.

Next, the positive resist film 1026 is peeled by a liftoff process, forming the gate electrode 1025 as shown FIG. 2(d). As described above, in the field-effect thin film transistor 1001, the gate electrode 1025 is self-aligned by being formed using the patterns of the source electrode 1022 and drain electrode 1023 on the glass substrate 1010 as masks.

When producing a top-gate type field-effect thin film transistor 1001 with a channel length of 50 μm and channel width of 500 μm, the overlap width of gate electrode 1025 and source electrode 1022 was about 0.5 μm or less and the overlap width of the gate electrode 1025 and the drain electrode 1023 was about 0.5 μm or less. When producing the same transistor except for the use of a mask specified for a gate electrode 1025, the overlap width of the gate electrode 1025 and the source electrode 1022 was about 3 μm and, similarly, the overlap width of the gate electrode 1025 and the drain electrode 1023 was about 3 μm.

In this way, in the field-effect thin film transistor 1001, the electrode overlap capacity of the source electrode 1022 and the gate electrode 1025, and the electrode overlap capacity of the drain electrode 1023 and the gate electrode 1025 are reduced. Thus, when operating the field-effect thin film transistor 1001, disadvantages such as unnecessary current consumption are suppressed and the driving ability is enhanced. Further, since a parasitic capacity is reduced, the high accuracy and speed of circuit operation are realized.

When the field-effect thin film transistor 1001 drives a capacitive load, the switching speed cannot be determined by the mobility of a semiconductor layer only and depends on an electrode overlap capacity as well. Since the electrode overlap capacity can be reduced, the switching speed of field-effect thin film transistor 1001 can be higher.

Even if the field-effect thin film transistor 1001 is connected to a capacitive load such as a liquid crystal cell, the electrode overlap capacity is reduced. Thus, the display vibration caused by the overlap capacity as well as the load voltage can be suppressed, thereby improving the image quality of displays.

FIRST APPLICATION EXAMPLE OF SELF-ALIGNMENT

Next, the first and second application examples of the self-alignment will be explained with reference to the drawing.

Figure 3:
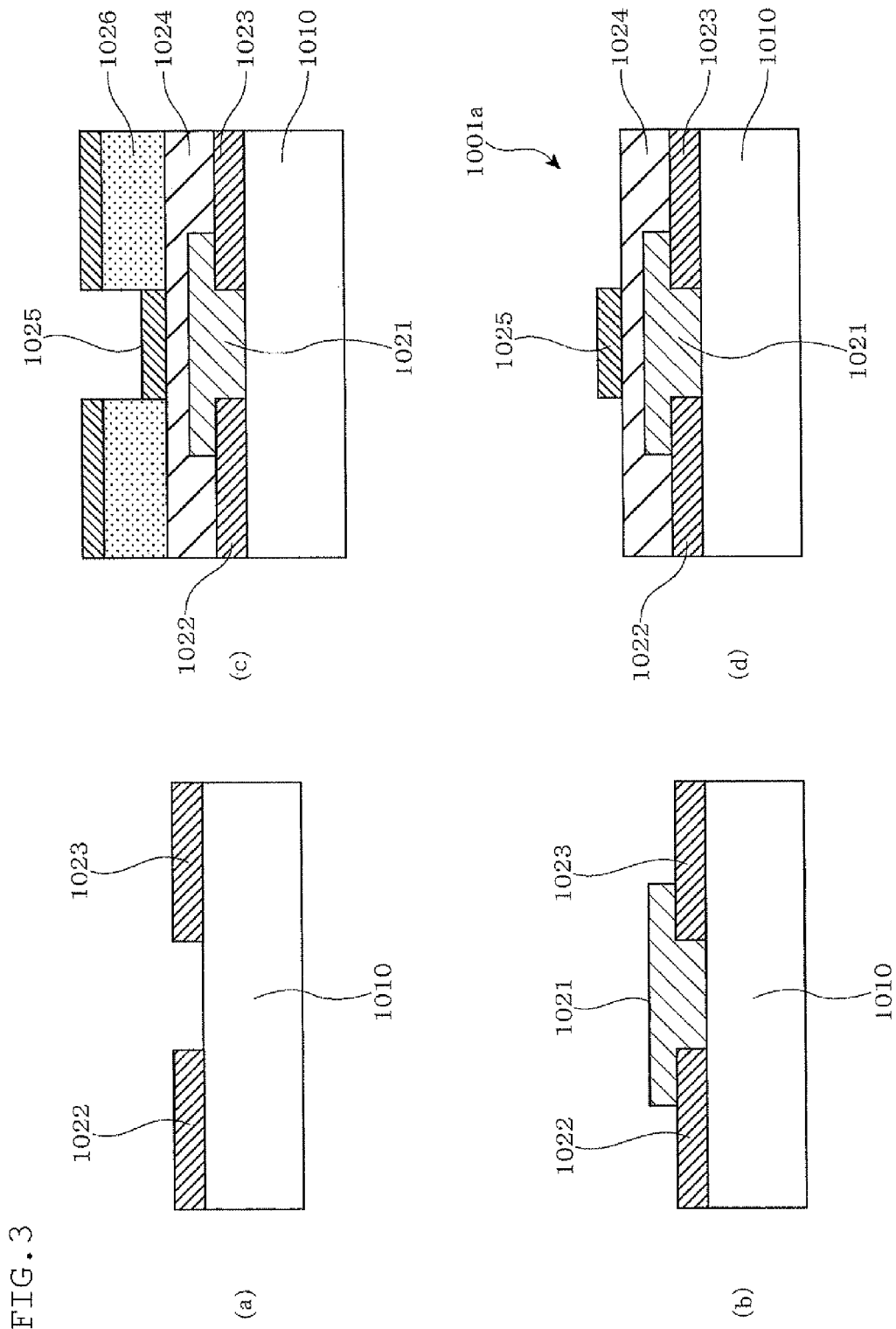
FIG. 3 is a schematic view, for explaining self-alignment, of essential parts of a first application example of a field-effect thin film transistor according to one embodiment of the present invention, in which (a) is a cross-sectional view showing the state in which a crystalline oxide is formed, (b) is a cross-sectional view showing the state in which a source electrode and a drain electrode are formed, (c) is a cross-sectional view showing the state in which a gate-insulating film, a resist and a gate electrode are stacked, and (d) is a cross-sectional view showing the state in which the gate electrode is formed.

FIG. 3 is a schematic view, for explaining self-alignment, of essential parts of a first application example of a field-effect thin film transistor according to one embodiment of the present invention, in which (a) is a cross-sectional view showing the state in which a crystalline oxide is formed, (b) is a cross-sectional view showing the state in which a source electrode and a drain electrode are formed, (c) is a cross-sectional view showing the state in which a gate-insulating film, a resist and a gate electrode are stacked, and (d) is a cross-sectional view showing the state in which the gate electrode is formed.

First, as shown in FIG. 3(a), in a top-gate type field-effect thin film transistor 1001a, a Mo/Al/Mo film and an IZO film (using a target containing 10.7 wt % of zinc oxide and 89.3 wt % of indium oxide) are formed on a transparent glass substrate 1010. These films are then subjected to an etching treatment by photolithography, whereby a source electrode 1022 and a drain electrode 1023 are formed. In the drawing, the Mo/Al/Mo thin film is not distinguished from the IZO film.

Next, as shown in FIG. 3(b), an amorphous transparent indium oxide thin film (using a target containing 5 wt % of zinc oxide and 95 wt % of indium oxide) is deposited, followed by patterning. Here, by using an aqueous oxalic acid solution as an etching solution, the transparent amorphous indium oxide thin film and the IZO film can be selectively etched.

Subsequently, in the air, a heat treatment is conducted at 300° C. for 1 hour, whereby the above-mentioned transparent amorphous indium oxide thin film becomes a crystalline oxide 1021 (crystalline indium oxide thin film).

Next, as shown in FIG. 3(c), on the source electrode 1022, the drain electrode 1023 and the crystalline oxide 1021, the gate-insulating film 1024 which is formed of an oxide such as $Al_2O_3$ is deposited, and then the positive-resist film 1026 is applied.

Then, as mentioned above, the positive-resist film 1026 is exposed to, for example, g rays with a wavelength of 436 nm, i rays with a wavelength of 365 nm or the like from the substrate side (from below the glass substrate 1010 in the drawing) by using the source electrode 1022 and the drain electrode 1023 as masks.

Next, by developing the positive-resist film 1026, a non-exposed part of the positive-resist film 1026 which corresponds to the patterns of the source electrode 1022 and the drain electrode 1023 remains, and the exposed part is removed. The edge of the remaining positive-resist film 1026 corresponding to the gate electrode 1025 coincides with the end portions of the source electrode 1022 and the drain electrode 1023 which have been formed in advance. Subsequently, on the positive-resist film 1026 and the gate-insulating film 1024, a metal thin film which will be the gate electrode 1025 is deposited.

Next, the positive-resist film 1026 is peeled off by the liftoff method, whereby the gate electrode 1025 is formed as shown in FIG. 3(d). As mentioned above, in the case of the field-effect thin film transistor 1001a, self-alignment of the gate electrode 1025 is attained by forming the gate electrode 1025 by using as masks the patterns of the source electrode 1022 and the drain electrode 1023 formed on the glass substrate 1010.

SECOND APPLICATION EXAMPLE OF SELF-ALIGNMENT

Figure 4:
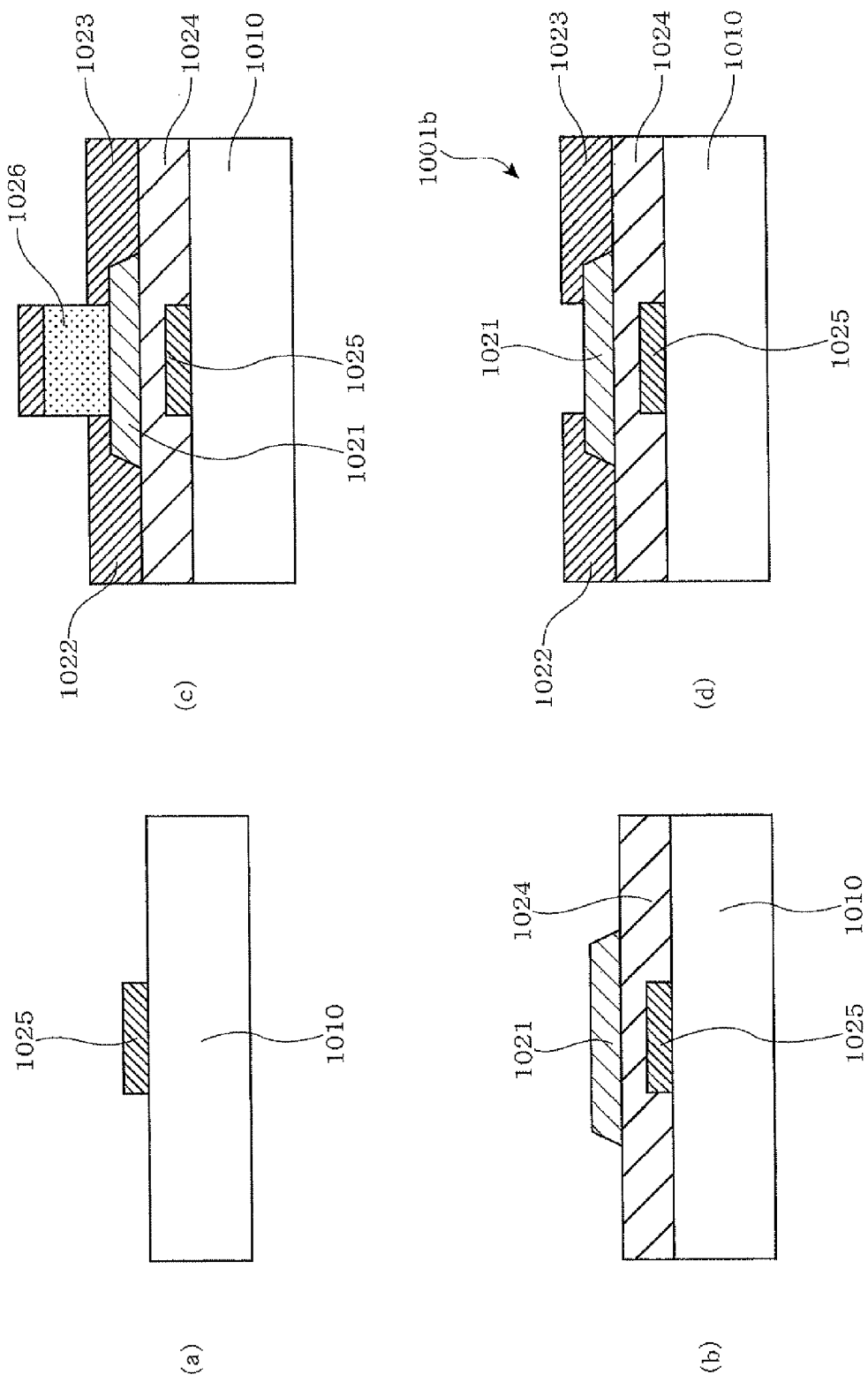
FIG. 4 is a schematic view, for explaining self-alignment, of essential parts of a second application example of a field-effect thin film transistor according to one embodiment of the present invention, in which (a) is a cross-sectional view showing the state in which a gate electrode is formed, (b) is a cross-sectional view showing the state in which a gate-insulating film is stacked and a crystalline oxide is formed, (c) is a cross-sectional view showing the state in which a resist, a source electrode and a drain electrode are stacked, and (d) is a cross-sectional view showing the state in which the source electrode and the drain electrode are formed.

FIG. 4 is a schematic view, for explaining self-alignment, of essential parts of a second application example of a field-effect thin film transistor according to one embodiment of the present invention, in which (a) is a cross-sectional view showing the state in which a gate electrode is formed, (b) is a cross-sectional view showing the state in which the gate-insulating film is stacked and a crystalline oxide is formed, (c) is a cross-sectional view showing the state in which a resist, a source electrode and a drain electrode are stacked, and (d) is a cross-sectional view showing the state in which the source electrode and the drain electrode are formed.

First, as shown in FIG. 4(a), in the bottom-gate type field-effect thin film transistor 1001b, the gate electrode 1025 formed of a metal thin film is formed on the transparent glass substrate 1010.

Next, as shown in FIG. 4(b), on the glass substrate 1010 and the gate electrode 1025, the gate-insulating film 1024 which is formed of an oxide such as $Al_2O_3$ is deposited. Then, by the sputtering method, or the like, a transparent amorphous indium oxide thin film (using a target containing 5 wt % of zinc oxide and 95 wt % of indium oxide) is deposited. Here, since the gate-insulating film 1024 and the transparent amorphous indium oxide thin film can be formed into a film without breaking a vacuum, impurities can be prevented from invading into the interface of the semiconductor layer (the crystalline oxide 1021) and the gate-insulating film 1024. Then, by the common photolithographic method, the transparent amorphous indium oxide thin film is subjected to an etching treatment and patterned. Then, in the air, a heat treatment is conducted at 300° C. for 1 hour, whereby the above-mentioned transparent amorphous indium oxide thin film becomes the crystalline oxide 1021 (crystalline indium oxide thin film).

Next, as shown in FIG. 4(c), the positive-resist film 1026 is applied and the positive-resist film 1026 is exposed to, for example, g rays with a wavelength of 436 nm from the substrate side (from below the glass substrate 1010 in the drawing) by using the gate electrode 1025 as a mask. This exposure can be conducted by scanning a laser light having a strong tendency of advancing straight.

Next, by developing the positive-resist film 1026, a non-exposed part of the positive-resist film 1026 which corresponds to the pattern of the gate electrode 1025 remains, and the exposed part is removed. The edge of the remaining positive-resist film 1026 corresponding to the source electrode 1022 and the drain electrode 1023 coincides with the edge of the gate electrode 1025 previously formed. Subsequently, on the gate-insulating film 1024, the crystalline oxide 1021 and the positive-resist film 1026, an IZO film (using a target containing 10.7 wt % of zinc oxide and 89.3 wt % of indium oxide) and a Mo/Al/Mo film is formed. In the drawing, the Mo/Al/Mo thin film is not distinguished from the IZO film.

Next, the positive-resist film 1026 is peeled off by the liftoff method, whereby the source electrode 1022 and the drain electrode 1023 are formed as shown in FIG. 4(d). As mentioned above, in the case of the field-effect thin film transistor 1001b, the source electrode 1022 and the drain electrode 1023 are formed by using as a mask the pattern of the gate electrode 1025 formed on the glass substrate 1010. That is, the source electrode 1022 and the drain electrode 1023 are formed by self-alignment using the gate electrode 1025.

Further, when the field-effect thin film transistor 1001 b with a channel length of 50 μm and a channel width of 500 μm was prepared, the overlap width of the gate electrode 1025 and the source electrode 1022 was about 0.1 μm, and the overlap width of the gate electrode 1025 and the drain electrode 1023 was about 0.1 μm. In addition, when the source electrode 1022 and the drain electrode 1023 were produced using a dedicated mask, the overlap width of the gate electrode 1025 and the source electrode 1022 was about 4 μm, and, similarly, the overlap width of the gate electrode 1025 and the drain electrode 1023 was about 4 μm.

As mentioned above, in the case of the field-effect thin film transistors 1001, 1001a and 1001 b, the overlap capacity of the gate electrode 1025 and the source electrode 1022, and the overlap capacity of the gate electrode 1025 and the drain electrode 1023 are reduced. As a result, the field-effect thin film transistors 1001, 1001 a and 1001 b have an improved driving ability and turn to be a transistor with less power consumption. Furthermore, in the production step, the number of masks and the mask steps for forming the gate electrode 1025, and the source electrode 1022 and the drain electrode 1023 can be reduced. Therefore, the production cost can be reduced.

In the TFT 1001, the In-containing crystalline oxide 1021 is used as an N-type semiconductor (in this embodiment, an active layer). The electron career concentration of the crystalline oxide 1021 is allowed to be less than $10^{18}/cm^3$. Here, the reason for allowing the electron career concentration to be less than $10^{18}/cm^3$ is that, when an oxide with an electron carrier concentration of $10^{18}/cm^3$ or more is used in the active layer of the TFT 1001, it is impossible to increase the on-off ratio sufficiently, and a large amount of current is flown between the source electrode 1022 and the drain electrode 1023 even when no gate voltage is applied to the TFT 1001, whereby no normally-off operation can be realized.

The electron carrier concentration of the crystalline oxide 1021 according to the present invention is a value measured at room temperature. The room temperature is, for example, 25° C. Specifically, it is a temperature which can be appropriately selected from a range of about 0 to 40° C. The electron carrier concentration of the crystalline oxide 1021 according to the present invention does not necessarily fall within the above-mentioned range in the entire temperature range of about 0 to 40° C. For example, it suffices that an electron carrier concentration of less than $10^{18}/cm^3$ be realized at about 25° C. In addition, the yield of a normally-off TFT 1001 is improved if the electron carrier concentration is further lowered to $10^{17}/cm^3$ or less, more preferably $10^{16}/cm^3$ or less.

The lower limit of the electron carrier concentration of the crystalline oxide 1021 is not particularly limited insofar as it can be applied as the active layer of a TFT. Therefore, in the present invention, by controlling the material, composition ratio, manufacturing conditions, post-treatment conditions, or the like of the crystalline oxide, as in the case of the examples given later, the electron career concentration is allowed to be $10^{12}/cm^3$ or more and less than $10^{18}/cm^3$, for example. Moreover, it is preferred that the electron carrier concentration be $10^{13}/cm^3$ or more and $10^{17}/cm^3$ or less, further preferably $10^{15}/cm^3$ or more and $10^{16}/cm^3$ or less. With this range, it is possible to obtain a normally-off TFT 1001 having a predetermined electron mobility in a high yield.

The electron carrier concentration is measured by the Hall effect measurement. It is preferred to perform the AC Hall measurement when measuring the electron carrier concentration of less than about $10^{17}/cm^3$. The reason therefor is that, in the DC Hall measurement, there is a large degree of variation in measurement values, which may cause measurement reliability to be deteriorated.

The active layer of the TFT 1001 (semiconductor thin film) is a thin film containing a crystalline substance (that is, the crystalline oxide 1021). As for the crystalline oxide 1021, at least part or all of the semiconductor thin film is crystalline. As a result, as compared with the case where the semiconductor thin film is amorphous, the carrier concentration can be decreased or controlled easily, and the operation of the TFT 1001 becomes stable. As a result, the performance of the TFT 1001 such as electric characteristics, stability, uniformity, reproducibility, heat resistance and durability can be improved.

The crystalline substance to be contained in the thin film may be either mono-crystalline or polycrystalline (including an epitaxial film). A polycrystalline film which is easily manufactured on the industrial basis and can contribute to an increase in area is preferable. A polycrystal is preferable, since a single crystal may have cracks by bending or impact during the production process. For this reason, it is preferable to use a polycrystal.

In the present invention, the crystalline oxide 1021 means an oxide exhibiting a specific diffraction pattern in the X-ray diffraction spectrum. On the other hand, an amorphous oxide means an oxide which shows a harrow pattern and does not exhibit a specific diffraction pattern.

Furthermore, it is preferred that the energy band gap between the conduction band and the valence band of the semiconductor thin film according to the present invention be about 2.8 eV or more. Due to such a band gap, a disadvantage that electrons of the valence band are excited by the irradiation of visible rays to allow a leak current to be flown easily can be effectively avoided.

Further, it is preferred that the above-mentioned crystalline oxide 1021 be a nondegenerate semiconductor.

In this way, the off-current can be rendered small and the on/off ratio can be increased.

The above-mentioned crystalline oxide 1021 contains a positive divalent element.

Due to the presence of a positive divalent element, the electron carrier concentration can be decreased by the effect of extinguishing carriers generated by oxygen deficiency. In addition, as known in ITO or the like, the mean free path of the carrier is smaller than the size of crystal particles in the crystalline state. Therefore, the mean free path of the carrier does not depend on the size of crystal particles. Therefore, the crystalline oxide 1021 can be a crystalline thin film with a high electron mobility. Further, in indium oxide, since the element added is a divalent metal element, this divalent metal element and oxygen undergo ionic bonding. Therefore, the oxide of the positive divalent element does not become a career scattering factor, and hence, the electron mobility can be kept high.

Moreover, although being inferior to the electron mobility of a thin film formed of a mono-crystalline oxide, the electron mobility of a thin film formed of this polycrystalline oxide 1021 is large. Furthermore, the thin film which is formed of the crystalline oxide 1021 can be more stabilized by containing a positive divalent element. Moreover, the field-effect mobility can be high, and the composition range for a stable crystalline oxide can be expanded.

Here, the positive divalent element means an element which can have two positive valences as the valence in the ionic state, and the positive trivalent element means an element which can have three positive valences as the valence in the ionic state.

Further, it is preferred that the above-mentioned positive divalent element be at least one element selected from Zn, Mg, Ni, Co and Cu.

In this way, at least part of the positive divalent element such as Zn solid-solution-substitutes indium, whereby the electron carrier concentration can be effectively reduced. Here, there is no particular restriction of the solid-solution-substituted amount of a metal added such as Zn. It suffices that even part of the metal be solid-solution-substituted. The crystalline oxide 1021 may be an oxide mixture.

Moreover, Zn and other divalent Mg, Ni, Co and Cu may be added simultaneously. For example, when adding Zn and Mg simultaneously, the electron mobility increases as compared with the case where Zn is added alone. The amount of this increase is about 10 $cm^2/(V \cdot sec)$ in the case of electron mobility at room temperature, which is an increase by one figure or more, compared to an amorphous silicon. Furthermore, since electric resistivity also increases and the electron mobility decreases with an increase in Mg content when a film is formed at the same conditions, the content of the positive divalent elements which consist of Zn and Mg is preferably larger than 0.5 at % and less than 10 at % relative to all metal atoms. The reason therefor is as follows. If the content is 0.5 at % or less, no improvement in electrical resistance is found even if the film is crystallized. If the content is 10 at % or more, the film is hard to be crystallized, and as a result, a need arises that the crystallization temperature is set high, resulting in larger energy consumption, which is economically disadvantageous.

That is, it is preferred that the atomic ratio of the number of the atoms of the positive divalent element ([M2]) to the number of the atoms of all metal elements contained in the crystalline oxide 1021 ([A]) be $0.005 < [M2]/[A] < 0.1$.

With this range, a more stable crystalline oxide can be obtained. In addition, the electronic career concentration can be controlled to less than $10^{18}/cm^3$.

Moreover, it is more preferred that $0.01 \leq [M2]/[A] < 0.08$. In addition, even Mg is selected instead of Zn, for example, almost similar results can be obtained. That is, Zn, Mg, Ni, Co and Cu exhibit almost similar effects.

In the above statement, the amount of careers generated by oxygen deficiency is controlled by the amount of the divalent metal elements contained in the crystalline oxide 1021. That is, it is also preferable to control the carrier amount by crystallization by, after the film formation, subjecting the indium oxide film to a post-treatment in an atmosphere containing oxygen to allow it to be crystallized, as well as to control (reduce or increase) the amount of oxygen deficiency by the reaction with oxygen in the air. In order to control the amount of oxygen deficiency effectively, the temperature of the oxygen-containing atmosphere is 150° C. or more and 500° C. or less, preferably 200° C. or more and 350° C. or less, further preferably 250° C. or more and 300° C. or less. It is also preferable to perform the crystallization and the reaction with oxygen simultaneously.

In addition, by conducting carrier control and eliminating oxygen deficiency by performing film formation in an oxygen-containing atmosphere and further performing a heat treatment for crystallization, the electric career concentration is allowed to be a predetermined value (less than $10^{18}/cm^3$). Further, in the post-treatment after the film formation, the post-treatment may be in an atmosphere which contains oxygen. If a predetermined electron carrier concentration (less than $10^{18}/cm^3$) can be obtained, no oxygen partial pressure control may be conducted during the film formation, and the post-treatment after the film formation may be conducted in an atmosphere which does not contain oxygen.

The above-mentioned crystalline oxide 1021 may contain, instead of a positive divalent element, a positive trivalent element which is different from indium.

In this way, the electron carrier concentration can be decreased by the effect of distinguishing carriers generated by oxygen deficiency. Moreover, although being inferior to the electron mobility of a thin film formed of a mono-crystalline oxide, the electron mobility of a thin film formed of this polycrystalline oxide 1021 can be large. Furthermore, the thin film which is formed of the crystalline oxide 1021 can be more stabilized by containing a positive trivalent element. Moreover, the field-effect mobility can be high, and the composition range for a stable crystalline oxide can be expanded. Further, in indium oxide, since the element added is a trivalent metal element, this trivalent metal element and oxygen undergo ionic bonding. Therefore, the oxide of the positive trivalent element does not become a career scattering factor, and hence, the electron mobility can be kept high.

Moreover, it is preferred that the above-mentioned positive trivalent element be at least one element selected from B, Al, Ga, Sc, Y and a lanthanoid element.

In this way, the crystalline oxide is stably crystallized due to a strong ionic bonding of B, Al, Ga, Sc, Y and a lanthanoid element. In addition, in a composite indium oxide formed of ions of which the difference in ionic radius among the ions is small, the crystalline phase is more stabilized. For example, in the case of an In-lanthanoid element-oxygen-based crystalline oxide 1021, the ionic radius decreases such that it becomes closer to the ionic radius of indium with an increase in the atomic number of a lanthanoid element. As a result, it is difficult to obtain a crystalline indium film which can be stably heat-treated in the case of an ion with a small atomic number. It is preferred that the content of a lanthanoid element be 0.5 at % to 5 at % to the number of the atoms of all metal elements. With this range, a stable crystalline film can be obtained. In addition, in the case of an ion with a large atomic number, a crystalline indium oxide film which can be stably heat-treated can be obtained easily, whereby a significantly stable crystalline film can be obtained.

Further, B, Al, Ga, Sc, Y and a lanthanoid element strongly bonds with oxygen (the work function of the metal is smaller than that of In metal), and hence, it hardly suffers oxygen deficiency when crystallized. Therefore, generation of carriers derived from oxygen deficiency can be suppressed effectively.

As mentioned above, it is preferred that the atomic ratio of the number of the atoms of the positive trivalent element which is different from indium ([M3]) to the number of the atoms of all metal elements contained in the crystalline oxide 1021 ([A]) be $0.005 < [M3]/[A] < 0.05.$ The reason therefor is as follows. If the atomic ratio is 0.5 at % or less, the effects of addition may not be obtained. In addition, if the atomic ratio is 5 at % or more, the crystallization temperature becomes too high to be practical.

With this range, a more stable crystalline oxide can be obtained and the electron carrier concentration can be controlled to less than $10^{18}/cm^3$.

If Y is selected instead of B, almost similar effects can be obtained and B, Al, Ga, Sc, Y and a lanthanoid element exhibit almost similar effects.

Further, the configuration is not limited to one in which either one of the positive divalent element and the positive trivalent element is contained. It is also possible to contain both the positive divalent element and the positive trivalent element. In this way, carrier generation can be suppressed further more effectively. That is, due to the presence of the positive divalent element, the electron carrier concentration can be reduced by the effect of distinguishing carriers generated by oxygen deficiency. In addition, by containing a positive trivalent element which is different from indium, oxygen deficiency hardly occurs, whereby generation of carriers derived from oxygen deficiency can be effectively prevented. Although being lower than the electron mobility of a thin film formed of a mono-crystalline oxide, a thin film formed of this polycrystalline oxide 1021 can have a large degree of electron mobility.

Further, it is preferred that the atomic ratio of the number of the atoms of the positive divalent atom ([M2]) and the atomic ratio of the number of atoms of the positive trivalent element which is different from indium ([M3]) to the number of the atoms of all metal elements contained in the crystalline oxide 1021 ([A]) be $0.005 < [M2]/[A] < 0.1$ $0.005 < [M3]/[A] < 0.05$ With this range, a more stable crystalline oxide can be obtained. Further, the electron carrier concentration can be controlled to less than $10^{18}/cm^3$.

As mentioned above, by using the crystalline oxide 1021 which contains a positive divalent element and/or a positive trivalent element which is different from indium as the active layer, it is possible to realize transistor properties that the on-off ratio exceeds $10^3$ in an normally-off state in which a gate current of less than 0.1 µA is flown with the transistor is being off.

In addition, in the field-effect thin film transistor 1001, in the pinch-off state, a high voltage is applied to a gate terminal and high-density electrons are present in the active layer. Therefore, according to the present invention, the saturation current value can be increased in an amount corresponding to an increase in electron mobility. As a result, improvement in transistor properties such as an increase in on-off ratio, an increase in saturation current and an increase in switching speed can be expected.

The crystalline oxide 1021 containing the positive divalent element or the positive trivalent element as mentioned above is formed into a film by the sputtering method, for example.

Next, an explanation is made on the Film-forming Example 1 of a thin film composed of the crystalline oxide 1021.

FILM-FORMING EXAMPLE 1

(First Film-forming Method: Sputtering Method)

In this film formation method, it is preferable to use the vapor phase deposition method which uses, as a target, an indium oxide polycrystalline sintered body with a composition of $In_2O_3(ZnO)_m$ (wherein m is an integer of 2 to 20). Of the vapor deposition methods, the sputtering method and the pulse laser deposition method are suitable. The sputtering method is most suitable in view of mass productivity.

However, if the amorphous film is formed under normal conditions, oxygen deficiency mainly occurs. Therefore, it has been impossible to allow the electron carrier concentration to be less than $10^{18}/cm^3$, which means an electrical resistance of $10^2$ Ωcm or more. If such a film is used, a normally-off transistor cannot be configured.

Figure 5:
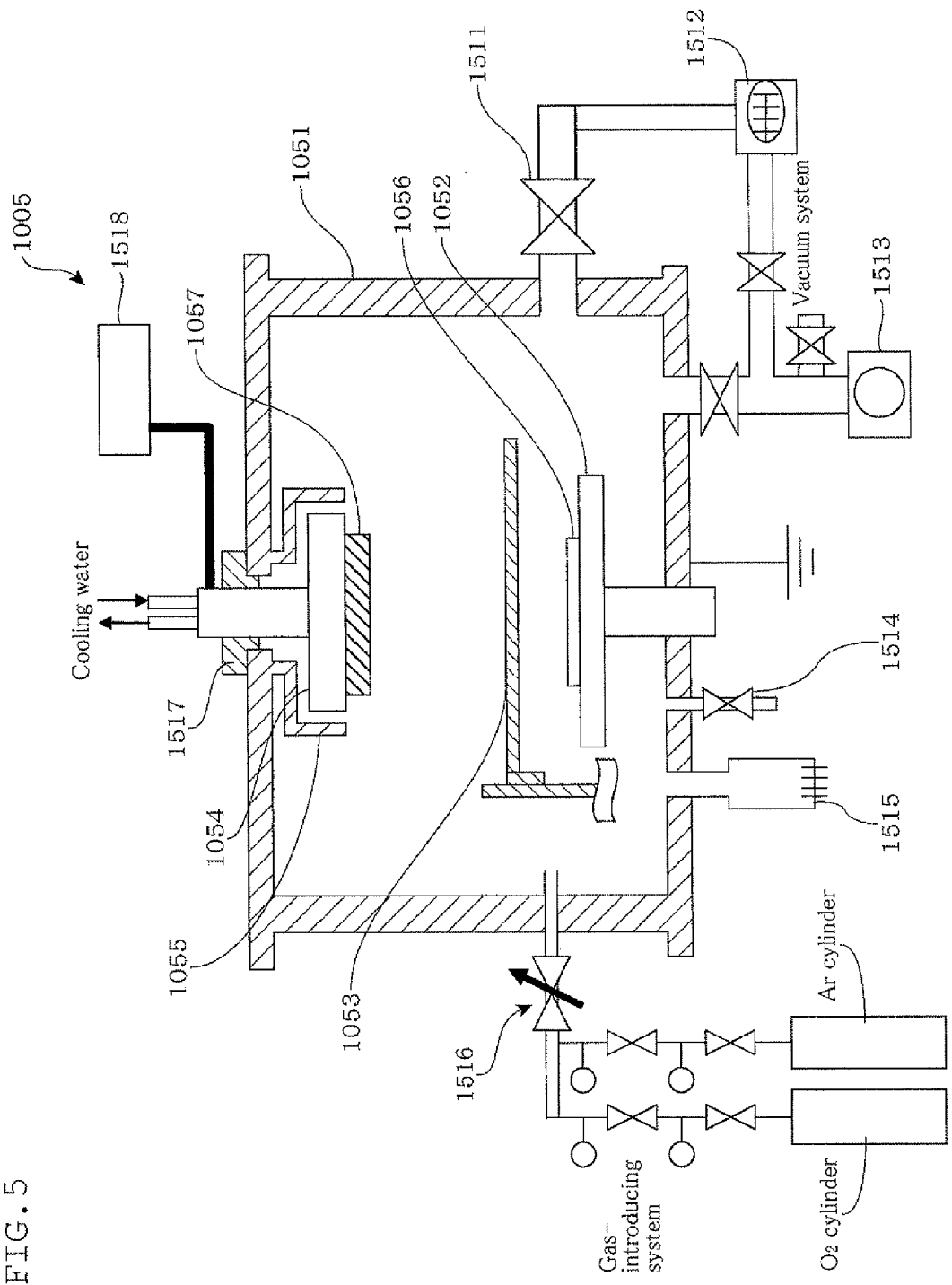
FIG. 5 is a schematic view of the sputtering apparatus by which the crystalline oxide according to Film-forming Example 1 and Film-forming Example 2 is prepared.

Therefore, the inventors prepared an amorphous zinc oxide-containing indium oxide by the sputtering method using the sputtering apparatus shown in FIG. 5. Then, the indium oxide was crystallized by heating in the air.

FIG. 5 is a schematic view of the sputtering apparatus by which the crystalline oxide according to Film-forming Example 1 and Film-forming Example 2 was prepared.

In a sputtering apparatus 1005 shown in FIG. 5, in a film-forming chamber (chamber) 1051, a substrate holder 1052 with cooling and heating mechanisms, a shutter 1053, an electrode 1054 and a shield 1055 are provided. Further, it is provided with a main valve 1511, a turbo molecular pump 1512, an oil rotating pump 1513, a leak valve 1514, a vacuum meter 1515 or the like for making the inside of the film-forming chamber 1051 vacuum. Further, an oxygen gas or an Ar gas is supplied to the film-forming chamber 1051 through the variable leak valve 1516. The electrode 1054 is attached to the film-forming chamber 1051 through an insulator 1517. Electric power is supplied to the electrode from a DC power supply, and the electrode 1054 is further cooled with cooling water. Further, a substrate 1056 is installed on the substrate holder 1052, and a target 1057 is attached to the electrode 1054.

By the sputtering method, an amorphous zinc oxide-containing indium oxide film was deposited on a $SiO_2$ glass substrate (1737 manufactured by Corning, Inc.). The amorphous film was then subjected to a heat treatment in the air at 300° C. for 1 hour, whereby a crystalline indium oxide film was obtained. As a treatment before the deposition, degreasing cleaning of the substrate was conducted by means of an ultrasonic wave. That is, the substrate was washed with acetone, ethanol and ultrapure water for about 5 minutes each, followed by drying at 100° C. in the air.

Further, as the polycrystalline target, an indium oxide polycrystalline target (size: 4 inches in diameter and 5 mm in thickness) containing $In_2O_3(ZnO)_4$ was used. As the starting material of this target, $In_2O_3:ZnO_4$ (each 4N reagent) was used. Further, the starting material was subjected to wet blending (solvent: ethanol), dry-granulating with a spray dryer, molding by means of a single-axis pressing machine, molding by cold isostatic pressing and sintering (36 hours at 1450° C.). The thus produced target had a bulk resistance of 0.005 (Ωcm) or less, and was excellent in conductivity. As a result, film formation by the RF sputtering method and the DC sputtering method becomes possible.

The ultimate vacuum of the sputtering chamber was allowed to be $5 \times 10^{-4}$ Pa and the oxygen concentration during sputtering was controlled to 3%, and film formation was conducted at 0.3 Pa with an argon gas.

The oxygen partial pressure within the sputtering chamber was 0.009 Pa and the substrate temperature was room temperature.

The distance between the target and the film-forming substrate was 80 mm and the power of the DC sputtering was in the range from 100 W to 200 W.

For the thus obtained thin film, grazing incidence X-ray diffraction (the thin film method, incidence angle: 0.5 degree) of the thin film was performed. No clear diffraction peak was observed. The zinc oxide-containing indium oxide thin film immediately after the production was amorphous.

After a heat treatment at 300° C. in the air for 1 hour, the thin film was subjected to low grazing incidence diffraction (the thin film method, incidence angle: 0.5 degree). A clear diffraction peak appeared, which was revealed to be derived from the bixbite structure of crystalline indium oxide. The obtained thin film was crystalline indium oxide.

Furthermore, as a result of an X-ray reflectance measurement to analyze the pattern, the average root mean square resistance (Rrms) of the thin film was about 0.8 nm, and the film thickness was about 100 nm. As a result of the analysis by the ICP method, the atomic ratio of the number of the atoms of Zn (=[Zn]) to the number of the atoms of all metal elements contained in the crystalline oxide (=[A]) [Zn]/[A] was found to be 0.08. In this Film-forming Example, [A] was equal to [In]+[Zn]. [In] is the number of the atoms of In contained in the crystalline oxide.

The specific resistance was about $10^4$ Ωcm or more. The electron career concentration was about $10^6/cm^3$ or less and the electron mobility was presumed to be about 5 $cm^2$/(V·sec).

From the analysis of a light absorption spectrum, the forbidden band energy width of the thus obtained amorphous thin film was found to be about 3.5 eV. From the above, it was understood that the thus prepared crystalline indium oxide-based thin film was a transparent flat thin film which had a bixbite crystalline phase, suffered less oxygen deficiency and had a large electric resistance.

(Measurement Results Relating to the Crystallization Temperature and the Electron Carrier Concentration of the Crystalline Oxide)

Figure 6:
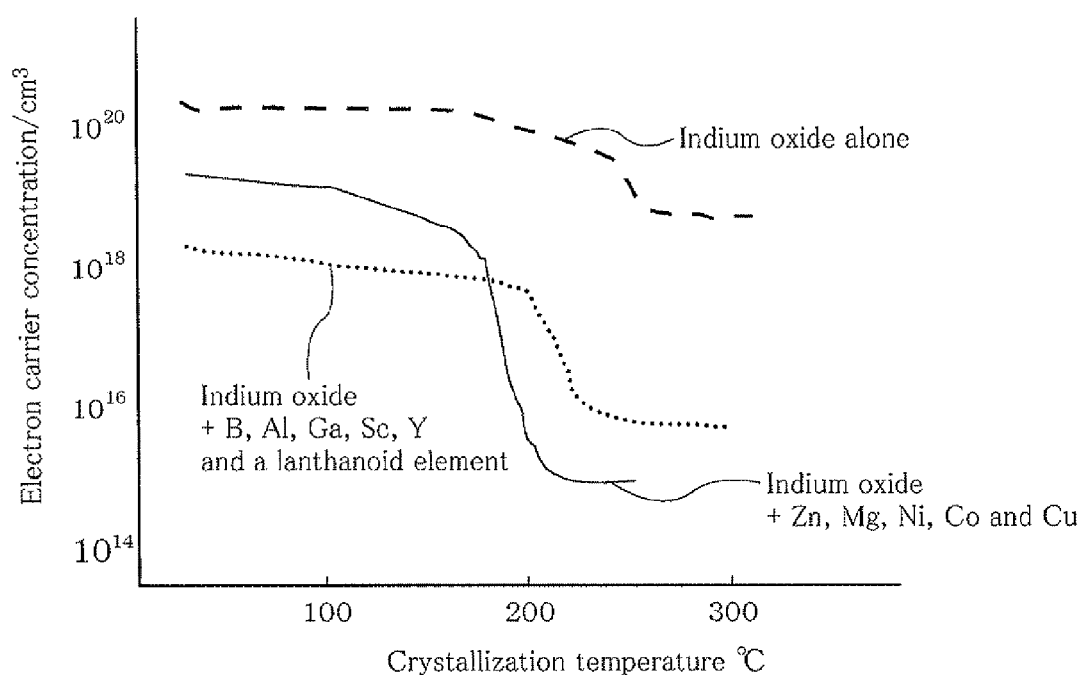
FIG. 6 is a graph of the crystallization temperature and the electron career concentration of the crystalline oxide according to Film-forming Example 1.

FIG. 6 is a graph of the crystallization temperature and the electron career concentration of the crystalline oxide according to Film-forming Example 1.

In FIG. 6, the thin line indicates a crystalline oxide 1021 obtained by adding to indium oxide a positive divalent element (Zn, Mg, Ni, Co and Cu, with Zn being a representative element) (hereinafter, appropriately abbreviated as the crystalline oxide indicated by the thin line). For the crystalline oxide indicated by the thin line, a sputtering target was used which contains about 0.2 to 6 wt % of zinc oxide, with indium oxide being the rest. Further, a heat treatment was conducted in the air at each temperature for 1 hour. The carrier concentration was measured by the Hall measurement. Crystallinity was confirmed by the X-ray diffraction using the same sample.

Further, the dotted line indicates a crystalline oxide 1021 which is obtained by adding to indium oxide a positive trivalent element other than the above-mentioned indium (B, Al, Ga, Sc, Y, La, Nd, Sm, Eu, Gd, Dy, Ho, Er, Tm, Yb and Lu, with Yb being as a representative example) (hereinafter, appropriately abbreviated as the crystalline oxide indicated by the dotted line).

For the crystalline oxide indicated by the dotted line, a sputtering target was used which contains about 0.2 to 3 wt % of ytterbium oxide, with indium oxide being the rest. Further, a heat treatment was conducted in the air at each temperature for 1 hour. The carrier concentration was measured by the Hall measurement. Crystallinity was confirmed by the X-ray diffraction using the same sample.

The thick dashed line indicates a crystalline oxide formed only of indium oxide (hereinafter, appropriately abbreviated as the crystalline oxide indicated by the dashed line).

The crystalline oxide indicated by the thin line, the crystalline oxide indicated by the dotted line and the crystalline oxide indicated by the dashed line used in the measurement were produced in substantially the same manner as in the above-mentioned Film-forming Example 1, except for the crystallization temperature or the like. The electron carrier concentration relative to the crystallization temperature was measured.

In the case of the crystalline oxide indicated by the thin line, the electron carrier concentration suddenly dropped at a point where the crystallization temperature was about 180° C. The decrease of the electron carrier concentration stopped at a point where the crystallization temperature was about 220° C. For example, the crystalline oxide indicated by the thin line had an electron carrier concentration of about $1\times10^{15}/cm^3$ when crystallized at a point where the crystallization temperature was about 250° C. As a result of the X-ray diffraction, a clear peak was observed in an oxide which was heat-treated at a temperature higher than 180° C., and hence, the oxide was confirmed to have a bixbite structure.

In the case of the crystalline oxide indicated by the dotted line, the electron carrier concentration suddenly dropped at a point where the crystallization temperature was about 210° C. The decrease of the electron carrier concentration stopped at a point where the crystallization temperature was about 230° C. For example, the crystalline oxide indicated by the dotted line had an electron carrier concentration of about $10^{16}/cm^3$ when crystallized at a point where the crystallization temperature was about 250° C. As a result of the X-ray diffraction, a clear peak was observed in an oxide which was heat-treated at a temperature higher than 180° C., and hence, the oxide was confirmed to have a bixbite structure.

On the other hand, in the case of the crystalline oxide indicated by the dashed line, the electron carrier concentration suddenly dropped at a point where the crystallization temperature was about 240° C. The decrease of the electron carrier concentration stopped at a point where the crystallization temperature was about 250° C. For example, the crystalline oxide indicated by the dashed line had an electron carrier concentration of about $10^{19}/cm^3$ even when crystallized at a point where the crystallization temperature was about 250° C.

That is, the crystalline oxide indicated by the dotted line and the crystalline oxide indicated by the thin line can have an electron carrier concentration which is preferable as a semiconductor (about less than $10^{18}/cm^3$) by controlling the crystallization temperature.

The Hall measurement apparatus and the Hall measurement conditions are as follows.
[Hall Measurement Apparatus]
Resi Test 8310: manufactured by Toyo Corporation

[Measurement Conditions]
Room temperature (about 25° C.), about 0.5 [T], about $10^{-4}$ to $10^{-12}$ A, AC magnetic field Hall measurement From the above measurement results or the like, it is understood that, in order to control the electron carrier concentration effectively, it is preferable to conduct heating at a temperature of the oxygen-containing atmosphere of 150° C. or more and 500° C. or less, preferably 200° C. or more and 350° C. or less, and further preferably 250° C. or more and 300° C. or less.

In addition, by conducting a crystallization treatment in an atmosphere containing oxygen with a predetermined concentration, crystallization can be controlled effectively.

Further, although not shown, the electron carrier concentration can be further decreased by further increasing the added amount of a positive divalent element or a positive trivalent element, by conducting film formation at high temperatures to allow crystallization to be performed easily and by conducting the heat treatment at high temperatures.

The lower limit of the electron carrier concentration in the present invention depends on the type of device, circuit or apparatus in which the resulting indium oxide film is used. However, the lower limit is $10^{14}/cm^3$, for example.

In this embodiment, at first, an amorphous oxide is formed into a film at a low temperature. Next, the amorphous oxide film is heated to a crystallization temperature to obtain the crystalline oxide 1021 with a desired carrier concentration. The formation method is not limited thereto. For example, in the film formation, an amorphous oxide is formed into a film at high temperatures to form the crystalline oxide 1021.

Further, the film formation may be conducted in an atmosphere containing oxygen, and the crystallization treatment after the film formation may be conducted in an atmosphere containing oxygen. In addition, as long as a prescribed electron carrier concentration (less than $10^{18}/cm^3$) can be obtained, instead of conducting oxygen partial pressure control during the film formation, the crystallization treatment may be conducted in an atmosphere which contains oxygen.
(Measurement Results Relating to the Electron Carrier Concentration and the Electron Mobility of the Crystalline Oxide)

Next, the measurement results relating to the electron carrier concentration and the electron mobility of the thus obtained crystalline oxide 1021 will be explained with reference to the drawing.

Figure 7:
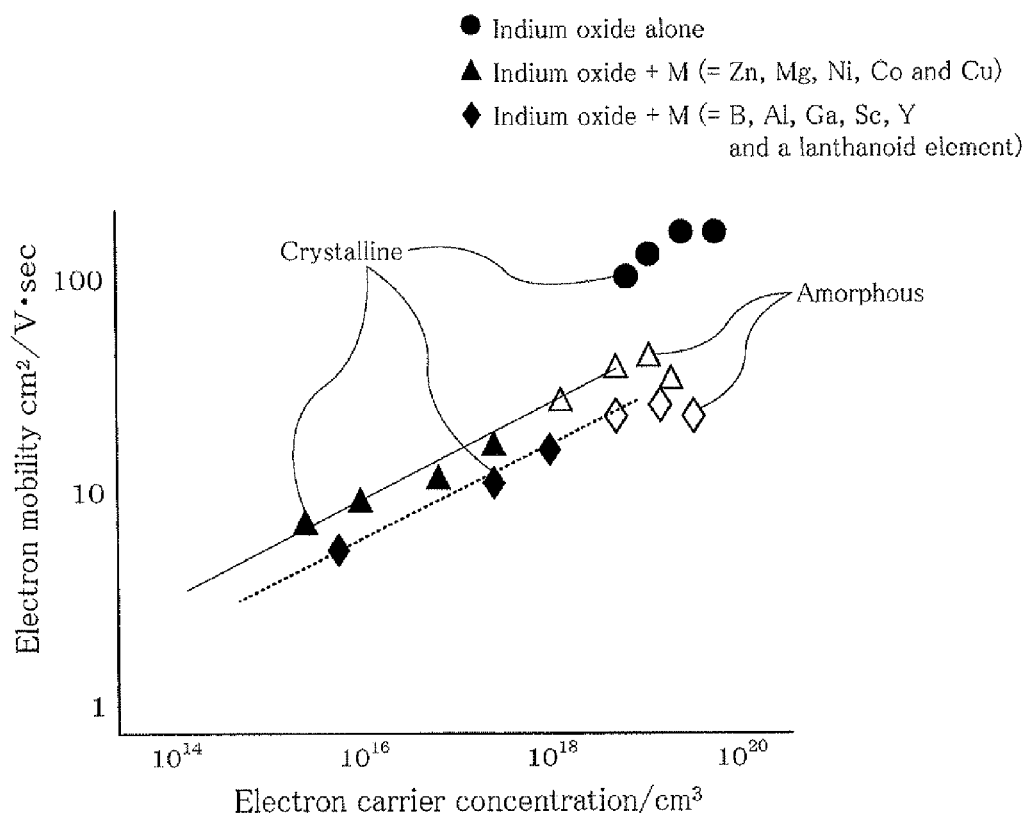
FIG. 7 is a graph of the electronic career concentration and the electron mobility of the crystalline oxide according to Film-forming Example 1.

FIG. 7 is a graph of the electronic career concentration and the electron mobility of the crystalline oxide according to Film-forming Example 1.

In FIG. 7, a black triangle indicates a crystalline oxide 1021 obtained by adding to indium oxide a positive divalent element (for example, Zn) (hereinafter appropriately abbreviated as the crystalline oxide indicated by the triangle). On the other hand, a white triangle indicates an amorphous oxide obtained by adding to indium oxide a positive divalent element.

A black diamond indicates a crystalline oxide 1021 obtained by adding to indium oxide a lanthanoid element (for example, Yb) (hereinafter appropriately abbreviated as the crystalline oxide indicated by the diamond).

In addition, a circle indicates a crystalline oxide composed only of indium oxide (hereinafter appropriately abbreviated as the crystalline oxide indicated the circle). A white diamond indicates an amorphous oxide obtained by adding to indium oxide a lanthanoid element.

The crystalline oxide indicated by the diamond and the crystalline oxide indicated by the triangle were obtained by controlling the crystallization temperature or the content of a lanthanoid element and a positive divalent element. Control of the electron carrier concentration to less than $10^{18}/cm^3$ or not depends on the conditions including the oxygen partial pressure, the heat treatment temperature, the configuration of a film-forming apparatus, the materials which are formed into a film, the composition or the like.

By controlling the production conditions (crystallization temperature or content), the crystalline oxide indicated by the triangle and the crystalline oxide indicated by the diamond had an electron carrier concentration of about $10^{16}/cm^3$ to about $10^{18}/cm^3$ and had an electron mobility of several $cm^2/V \cdot sec$ to ten-odd $cm^2/V \cdot sec$.

The crystalline oxide indicated by the circle had an electron carrier concentration of about $10^{19}/cm^3$ to about $10^{20}/cm^3$ and had an electron mobility of about $100\ cm^2/V \cdot sec$. In addition, the measurement results of the crystalline oxide indicated by the triangle and the crystalline oxide indicated by the diamond were one example. Although not shown, the crystalline oxide 1021 having improved properties could be produced by controlling the production conditions.

The amorphous oxide indicted by the white triangle or by the white diamond had an electron carrier concentration exceeding about $10^{18}/cm^3$ and had an electron mobility of ten-odd $cm^2/V \cdot sec$ to several tens $cm^2/V \cdot sec$.

Normal compounds show a tendency that the electron mobility decreases with an increase in the number of electrons due to the collision of electrons. In contrast, in the case of the crystalline oxide indicated by the diamond and the crystalline oxide indicated by the triangle, the electron mobility logarithmically proportionally increases in an electron carrier concentration range of about $1 \times 10^{16}$ to $1 \times 10^{18}/cm^3$. That is, if the electron carrier concentration (X coordinate) and the electron mobility (Y coordinate) are plotted in the graph of the both logarithms, the plotted points are almost on a straight line rising from the left to the right. In addition, depending on the combination of a positive divalent element or a positive trivalent element to be contained in the crystalline oxide 1021, the plotted points form almost straight different lines rising from the left to the right.

By effectively utilizing these unique properties, the electron carrier concentration or the electron mobility can be freely set to a desired value. As a result, it is possible to provide the crystalline oxide 1021 which has more preferable semiconductor properties for various semiconductor devices. In addition, the added value of the semiconductor device can be improved.

That is, in the above-mentioned measurement examples, it is possible to allow the electron mobility of the crystalline oxide 1021 to be used as the active layer of the field-effect thin transistor 1001 to be larger than 1 $cm^2/(V \cdot sec)$, preferably larger than 5 $cm^2/(V \cdot sec)$. As a result, the saturation current after the pinch-off can be larger than about 10 µA and the on-off ratio can be larger than about $10^3$. In addition, the electron carrier concentration is allowed to be less than $10^{18}/cm^3$, preferably less than $10^{16}/cm^3$. The current flown between the source electrode 1022 and the drain electrode 1023 in the off-state (when no gate voltage is applied) is allowed to be less than about 10 µA, preferably less than about 0.1 µA, whereby a normally-off transistor can be configured.

In the case of the field-effect thin film transistor 1001, in the pinch-off state, a high voltage is applied to the gate electrode 1025, and high-density electrons are present in the crystalline oxide 1021 as the active layer. Therefore, according to the present invention, the saturation current value can be increased in an amount corresponding to an increase in electron mobility, and almost all of the transistor properties including the on-off ratio, the saturation current and the switching speed are improved.

Meanwhile, an indium oxide ($In_2O_3$) film can be formed by the vapor phase deposition method. An amorphous film can be obtained by adding to a film-forming atmosphere about 0.1 Pa of moisture. This amorphous indium oxide film can be crystalline indium oxide by conducting a heat treatment. However, although a crystalline film can be obtained, in the case of a film composed only of $In_2O_3$, stable semiconductor properties cannot be exhibited even when about 30% of an oxygen gas is introduced into a film-forming atmosphere.

FILM-FORMING EXAMPLE 2

In this Film-forming Example, the crystalline oxide 1021 was formed by the direct current (DC) sputtering method in which an argon gas was used as an atmospheric gas. The film-forming method is not limited to the direct current (DC) sputtering method. For example, a radio-frequency (RF) sputtering method can be used.

As for the sputtering apparatus, the same sputtering apparatus as that used in the above-mentioned Film-forming Example 1 was used.

As the glass substrate 1010 for film formation, a $SiO_2$ glass substrate (1737, manufactured by Corning Inc.) was prepared. As the treatment before film formation, the glass substrate 1010 was subjected to ultrasonic degreasing cleaning. Specifically, the glass substrate 1001 was cleaned with acetone, ethanol and ultrapure water for 5 minutes each, followed by drying in the air at 100° C. It is preferable to conduct UV ozone cleaning to obtain a film improved in adhesion.

Further, as the target material, an indium oxide polycrystalline sintered body (size: 4 inches in diameter and 5 mm in thickness) with a composition of $In_2O_3(ZnO)_4$ was used.

As the starting material of this target, 99 wt % $In_2O_3$: 1 wt % ZnO (each 4N reagent) was used. Further, the starting material was subjected to wet blending (solvent: ethanol), dry-granulating with a spray dryer, molding by means of a single-axis pressing machine, molding by cold isostatic pressing and sintering (36 hours at 1450° C.). The specific resistance of the thus formed target was 0.005 (Ωcm).

The ultimate vacuum in the film-forming chamber 1051 was $5 \times 10^{-4}$ Pa. The total pressure of an oxygen gas and an argon gas during the film formation was a fixed value in the range of 0.1 to 2.0 Pa, and was varied within an oxygen concentration range of 1 to 30% by varying the partial pressure ratio of an argon gas and oxygen.

The substrate temperature was room temperature, and the distance between the target and the film-forming substrate was 80 mm. The substrate holder 1052 was provided with a rotation mechanism, and a thin film improved in uniformity could be obtained by conducting film formation by rotating.

The input power was DC 100 W and the film-forming speed was 5 nm/mm.

For the thus-obtained thin film, the film surface was subjected to grazing incidence X-ray diffraction (the thin film method, incidence angle: 0.5 degree). No clear diffraction peak was detected, which showed that the indium oxide thin film immediately after the production was amorphous. Thereafter, the film surface of the indium oxide thin film which had been heated to 200° C. or higher was subjected to grazing incidence X-ray diffraction (the thin film method, incidence angle: 0.5 degree). As a result, a clear diffraction peak was detected, which showed that the thin film was crystalline.

Furthermore, as a result of an X-ray reflectance measurement to analyze the pattern, the average root mean square resistance (Rrms) of the thin film was about 0.8 nm. As a result of the analysis by the ICP method, the atomic ratio of the number of the atoms of Zn ([Zn]) to the number of the atoms of all metal elements contained in the crystalline oxide ([A]) [Zn]/[A] was found to be 0.018. In this Film-forming Example, [A] was equal to [In]+[Zn]. [In] is the number of the atoms of In contained in the crystalline oxide.
(Measurement Results Relating to the Amount Ratio of the Added Elements and the Electric Resistivity of the Crystalline Oxide)

Next, by varying the kind, composition or the like of a positive divalent element and a positive trivalent element to be added and further by controlling the production conditions, a plurality of crystalline oxides 1021 were prepared.

The results of the measurement of the amount ratio of the added elements and the electric resistivity (specific resistance) in part of these crystalline oxides 1021 will be explained with reference to the drawing.

Figure 8:
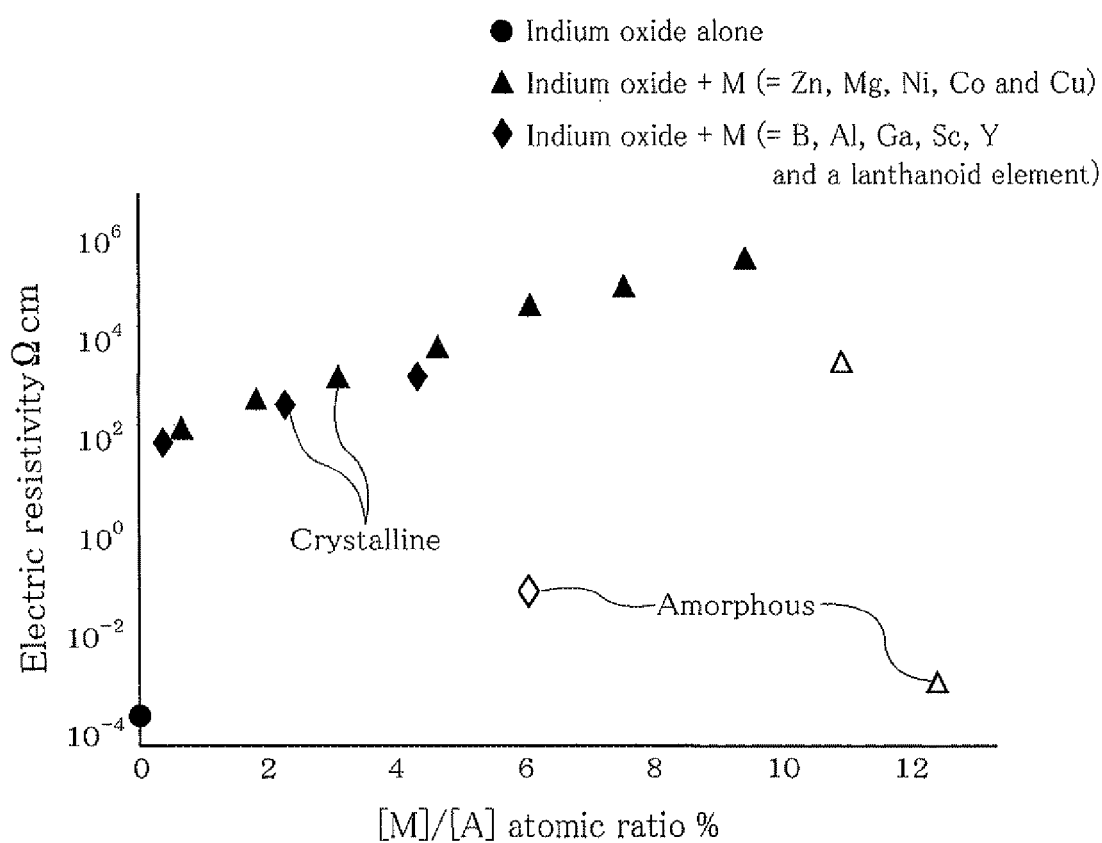
FIG. 8 is a graph of the atomic ratio of added elements and the electric resistivity in the crystalline oxide according to Film-forming Example 2.

FIG. 8 is a graph of the atomic ratio of added elements and the electric resistivity in the crystalline oxide according to Film-forming Example 2.

In FIG. 8, a black triangle indicates a crystalline oxide 1021 obtained by adding to indium oxide a positive divalent element (M=at least one selected from Zn, Mg, Ni, Co and Cu) (hereinafter appropriately abbreviated as the crystalline oxide indicated by the triangle). On the other hand, a white triangle indicates an amorphous oxide obtained by adding to indium oxide a positive divalent element.

A diamond indicates a crystalline oxide 1021 obtained by adding to indium oxide a positive trivalent element other than the above-mentioned indium (M=at least one selected from B, Al, Ga, Sc, Y, La, Nd, Sm, Eu, Gd, Dy, Ho, Er, Tm, Yb and Lu) (hereinafter appropriately abbreviated as the crystalline oxide 1021 indicated by the diamond). A white diamond indicates an amorphous oxide obtained by adding to indium oxide a positive trivalent element other than the above-mentioned indium.

In addition, a circle indicates a crystalline oxide composed only of indium oxide (hereinafter appropriately abbreviated as the crystalline oxide indicated by the circle).

The crystalline oxide indicated by the triangle had an electrical resistivity was about $10^2$ Ωcm to $10^5$ Ωcm when the atomic ratio of the number of the atoms of an added positive divalent element M ([M]) to the number of the atoms of all metal elements contained in the crystalline oxide 1021 ([A]) ([M]/[A]) was about 0.6% to 9.3%. That is, by adding a slight amount of a positive divalent element M, the electric resistivity was increased to about $10^2$ Ωcm or more. In addition, by further increasing the atomic ratio %, the electric resistivity could be further improved. For example, in the case of an indium oxide thin film containing 9.5 at % of zinc which was prepared at a substrate temperature of 25° C. and an oxygen partial pressure of 3%, the electric resistivity could be increased to about $10^5$ Ωcm. In the case of an amorphous indium oxide thin film formed with a zinc content of larger than 10 at %, the electric resistivity thereof decreased with an increase in the added amount of zinc. This amorphous film became a conductive thin film.

In addition, in the case of the crystalline oxide indicated by the diamond, the electric resistivity was about $10^2$ Ωcm to $10^3$ Ωcm when the atomic ratio of the number of the atoms of an added positive trivalent element M ([M]) to the number of the atoms of all metal elements contained in the crystalline oxide 1021 ([A]) ([M]/[A]) was about 0.3% to 4.2%. In the case of an amorphous indium oxide thin film formed with a positive trivalent element content of about 6 at %, the electric resistivity thereof decreased. This amorphous film became a conductive thin film.

The crystalline oxide indicated by the circle had an electric resistivity of about $10^{-3}$ Ωcm.

From the above result, in the crystalline oxide 1021, it is preferred that the zinc content be larger than about 0.1 at %, preferably larger than about 0.5 at %, and about 12 at % or less, preferably about 10 at % or less. In addition, it is preferred that the crystalline oxide 1021 have a bixbite structure of indium oxide as the crystal structure in the crystalline state and be a transparent crystalline indium oxide thin film. By using this transparent crystalline indium oxide thin film in the field-effect thin film transistor 1001, a normally-off transistor with an on-off ratio exceeding $10^3$ could be obtained.

It is possible to further increase the amount of zinc oxide to be added by performing the crystallization at much higher temperatures. However, in view of energy required for a high-temperature treatment, increasing the amount of zinc is not industrially preferable.

When the sputtering apparatus 1005, the materials or the like shown in this film-forming example are used, it is preferred that the crystallization treatment be conducted at 200° C. or more and 300° C. or less in the air, for example. Although not shown, in the case of the crystalline oxide 1021 in this film-forming example, the electron mobility logarithmically proportionally increases with an increase in electron carrier concentration. Further, it is preferable to conduct film formation in an atmosphere containing an oxygen gas while intentionally omitting the addition of impurity ions which serve to increase the electric resistivity.

Further, it is preferred that the crystalline oxide 1021 in this embodiment have resistance to PAN.

Due to the PAN resistance, the freedom of the production process can be enhanced, whereby the TFT 1001 can be produced efficiently. In addition, since no damage is exerted on the source electrode 1022 and the drain electrode 1023 when these electrodes are etched with a PAN-based etching solution, reliability or the like is improved. In this embodiment, the crystalline oxide 1021 is patterned in the amorphous state, and then crystallized. Since the crystallized crystalline oxide 1021 normally has resistance to PAN, the source electrode 1022 and the drain electrode 1023 can be patterned easily.

Here, the "having PAN resistance" means having an etching speed with a PAN-based etching solution of less than about 10 nm/min. Generally, as the PAN-based etching solution (an etching solution containing phosphoric acid, nitric acid and acetic acid), one which contains phosphoric acid of about 45 to 95 wt %, nitric acid of about 0.5 to 5 wt % and acetic acid of about 3 to 50 wt % is used.

PREPARATION EXAMPLE 1 OF A FIELD-EFFECT THIN FILM TRANSISTOR

Next, Preparation Example 1 of the field-effect thin film transistor 1001 using the above-mentioned crystalline oxide 1021 (see FIGS. 1 and 2) will be explained.

By the technique mentioned above, the top-gate type field-effect thin film transistor 1001 with a channel length of 50 μm and a channel width of 500 μm was prepared.

The field-effect thin film transistor 1001 in this preparation example had an on-off ratio of $10^5$ or more. The field-effect mobility was calculated from output characteristics. As a result, a field-effect mobility of about 7 cm$^2$/V·sec was obtained in the saturation range. Further, the threshold voltage (Vth) was about +2.0V, meaning that the transistor had normally-off properties. The output properties showed a clear pinch-off. When a voltage of about 5V was applied between the source electrode 1022 and the drain electrode 1023 when no gate voltage was applied, it was possible to allow the current flown between the source electrode 1022 and the drain electrode 1023 to be about $10^{-7}$A.

The similar measurements were conducted after irradiating the thus-produced field-effect thin film transistor 1001 with visible rays. No variation in transistor properties was admitted. That is, in this embodiment, a thin film transistor which had a small electron carrier concentration, and hence, had a high electric resistivity and a large electron mobility was realized.

(Evaluation of Characteristics of the Transistor)

Next, the current-voltage characteristics of the field-effect thin film transistor 1001 in this Preparation Example 1 will be explained with reference to the drawing.

Figure 9:
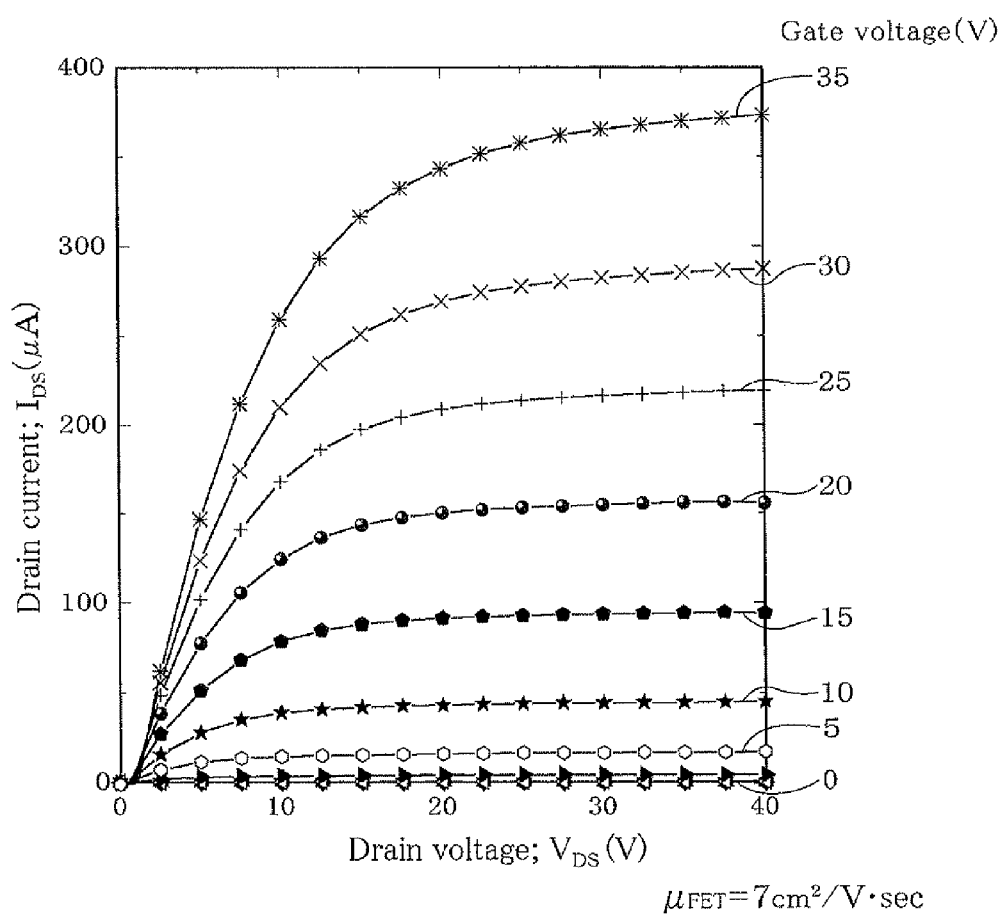
FIG. 9 is a graph of the current-voltage characteristics of the field-effect thin film transistor according to Production Example 1.

FIG. 9 is a graph of the current-voltage characteristics of the field-effect thin film transistor according to Preparation Example 1.

In FIG. 9, the current-voltage characteristics of the field-effect thin film transistor 1001 measured at room temperature are shown. From the fact that the drain current $I_{DS}$ increased with an increase in the gate voltage $V_{GS}$, it could be understood that the channel was an n-channel type semiconductor. This does not contradict the fact that the crystalline oxide indium-based semiconductor is an n-type semiconductor.

In addition, $I_{DS}$ showed typical behaviors as a semiconductor transistor; specifically it saturates (pinch-off) at around $V_{DS}$=10V. As a result of gain characteristics, the threshold value of a gate voltage $V_{GS}$ when 4V of $V_{DS}$ was applied was about 2.0V. In addition, when $V_G$ was 10V, a current $I_{DS}$=1.0× $10^{-5}$A was flown. This corresponds to the fact that carriers were induced by gate bias in the crystalline indium oxide semiconductor thin film in the insulating semiconductor.

In this preparation example, the field-effect thin film transistor 1001 was formed on the glass substrate 1010. Since the film formation itself can be performed at room temperature and the film can be then crystallized at low temperatures by the low temperature plasma crystallization method or the like, a substrate such as a plastic plate or film can be used. The crystalline indium oxide thin film obtained in this preparation example absorbs almost no visible rays, and a transparent flexible TFT can be realized.

As mentioned above, by using the above-mentioned crystalline oxide 1021 in the active layer, the field-effect thin film transistor 1001 of this embodiment can exhibit transistor properties that the on-off ratio exceeds $10^3$ in a normally-off state in which a gate current of less than 0.1 μA is flown with the transistor being off. In addition, the substrate may have transparency or light transmittance for visible rays and further it may have flexibility. Moreover, electric characteristics, stability, uniformity, reproducibility, heat resistance, durability or the like of the field-effect thin film transistor 1001 can be improved, and the overlap capacity between the electrodes can be reduced. In addition, it is possible to provide a TFT substrate improved in large-area-uniformity or reproducibility.

Hereinabove, the field-effect transistor of the present invention is explained with reference to preferred embodiments. The configuration of the field-effect transistor of the present invention is not limited to the embodiments as mentioned above. It is needless to say various modifications are possible within the scope of the present invention.

For example, the configuration of the field-effect thin film transistor is not limited to the above-mentioned bottom-gate type or top-gate type configuration. Field-effect thin film transistors may have various structures.

[First Embodiment of the Method for Producing the Field-effect Transistor]

Figure 10:
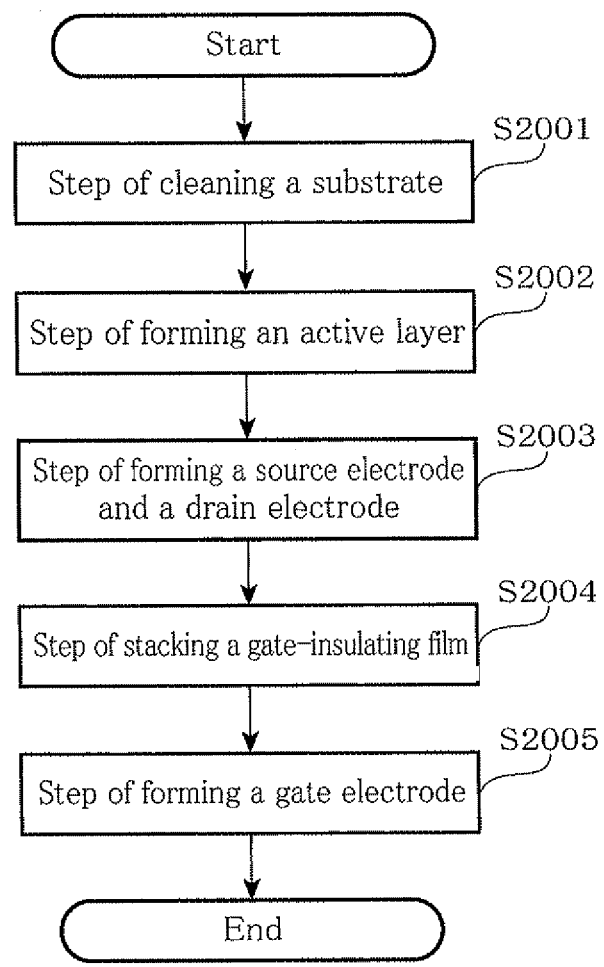
FIG. 10 is a schematic flow chart for explaining the method for producing a field-effect thin film transistor according to the first embodiment of the present invention.

FIG. 10 is a schematic flow chart for explaining the method for producing a field-effect thin film transistor according to the first embodiment of the present invention.

Figure 11:
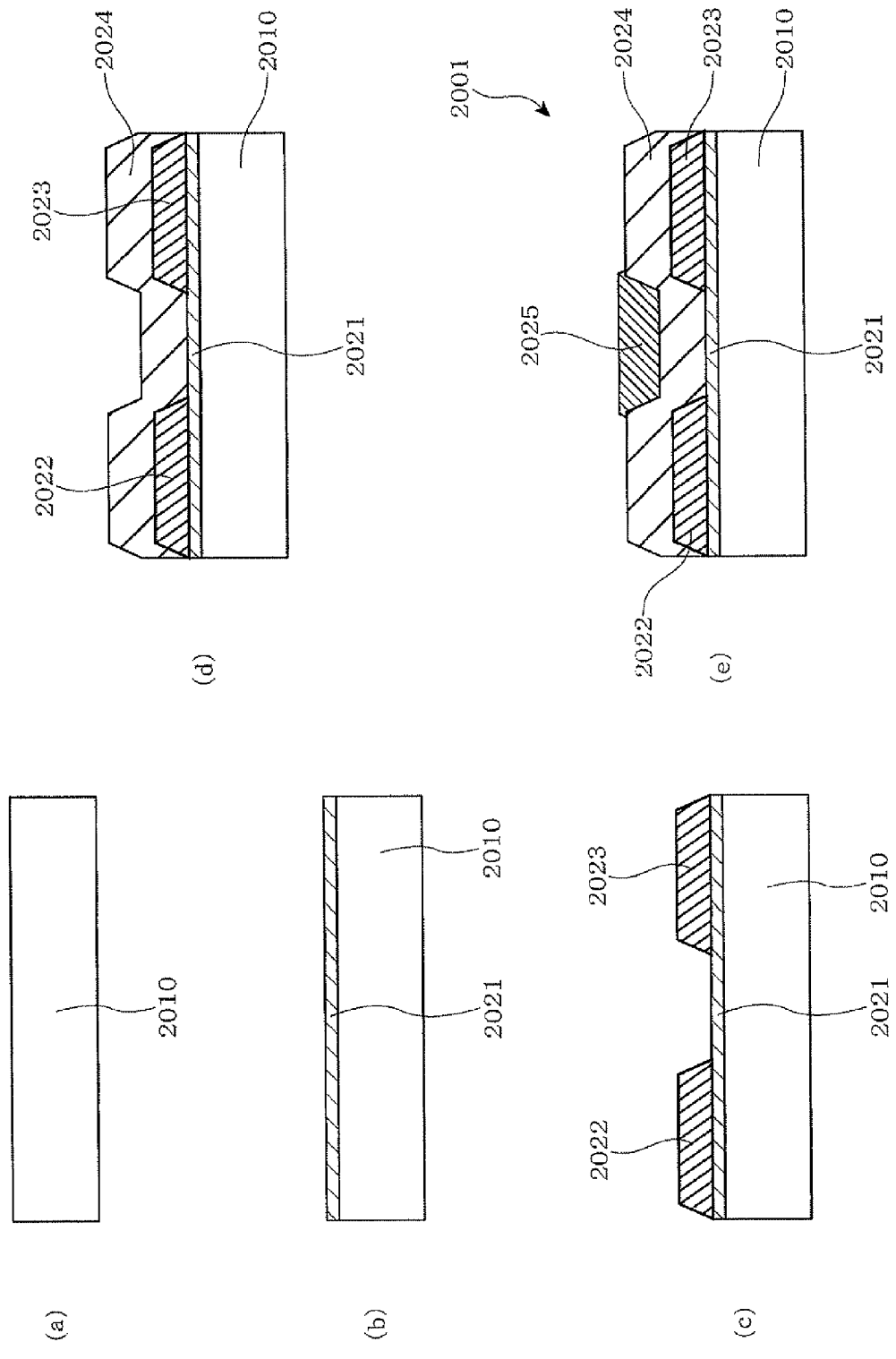
FIG. 11 is a schematic view of essential parts for explaining the method for producing a field-effect thin film transistor according to the first embodiment of the present invention, in which (a) is a cross-sectional view of a substrate which has been cleaned, (b) is a cross-sectional view showing the state in which an active layer is formed, (c) is a cross-sectional view showing the state in which a source electrode and a drain electrode are formed, (d) is a cross-sectional view showing the state in which a gate-insulating film is stacked, and (e) is a cross-sectional view showing the state in which the gate electrode is formed.

FIG. 11 is a schematic view of essential parts for explaining the method for producing a field-effect thin film transistor according to the first embodiment of the present invention, in which (a) is a cross-sectional view of a substrate which has been cleaned, (b) is a cross-sectional view showing the state in which an active layer is formed, (c) is a cross-sectional view showing the state in which a source electrode and a drain electrode are formed, (d) is a cross-sectional view showing the state in which a gate-insulating film is stacked, and (e) is a cross-sectional view showing the state in which a gate electrode is formed.

In FIG. 10 and FIG. 11(a), a glass substrate 2010 is prepared at first, and this glass substrate 2010 is cleaned (Step S2001). In this way, impurities which have been adhered to the surface of the glass substrate 2010 are removed, whereby the surface is cleaned. As a result, a disadvantage that the impurities scatter over a crystalline oxide 2021 which is to be deposited on the glass substrate 2010 to cause the performance to deteriorate can be prevented. In addition, due to the cleaning of the surface, adhesion of the crystalline oxide 2021 is improved.

In this embodiment, cleaning is performed by using a cleaning solution containing hydrogen peroxide. Examples of such cleaning solution include an aqueous solution containing hydrogen peroxide and ammonia, an aqueous solution containing hydrogen peroxide and hydrogen chloride, an aqueous solution containing hydrogen peroxide and hydrogen fluoride. Generally, as the cleaning method, a ultrasonic cleaning step using a cleaning solution and a ultrasonic rinsing step using pure water are repeated, and a drying step is finally performed in an atmosphere such as a nitrogen gas atmosphere.

The surface cleaning treatment of the glass substrate 2010 is not limited to the above-mentioned cleaning treatment. For example, ultraviolet irradiation in an ozone atmosphere, plasma irradiation or the like may be used. A plurality of cleaning treatments may be conducted by combining these.

By ultraviolet irradiation in an ozone atmosphere, a cleaned surface can be obtained. That is, if the substrate is irradiated with ultraviolet rays in an oxygen-containing atmosphere under the atmospheric pressure, ozone is generated and contaminants on the substrate surface are removed by the ozone and the ultraviolet rays.

The plasma irradiation treatment is a treatment in which low-energy plasma is caused to generate by means of a plasma generating apparatus, and the glass substrate 2010 is irradiated with thus-generated plasma. In this way, not only contaminants on the substrate surface are removed but also the condition of the substrate surface is improved to enhance the adhesion of the crystalline oxide 2021.

Then, as shown in FIG. 11(b), on the glass substrate 2010, an active layer composed of the crystalline oxide 2021 is formed in an atmosphere containing oxygen and/or water (Step S2002). That is, on a transparent glass substrate 2010, the crystalline oxide 2021 is formed by the sputtering method (using a target containing 5 wt % of zinc oxide and 95 wt % of indium oxide).

The atmosphere containing oxygen and/or water means an atmosphere which contains at least any of molecular oxygen, ozone gas, nitrogen oxide gas ($N_2O$, $NO_2$ and NO), oxygen-containing radicals, atomic oxygen, oxygen ions, oxygen radicals, water vapor and hydroxide ions. When the atmosphere containing oxygen and/or water is an atmosphere which contains at least any of an ozone gas, nitrogen oxide gas, oxygen-containing radicals, atomic oxygen, oxygen ions and oxygen radicals, since they have a stronger oxidizing power than molecular oxygen, it is possible to form effectively the crystalline oxide 2021 suffering only a small degree of oxygen deficiency. That is, since generation of oxygen deficiency can be suppressed effectively, the number of carriers generated by oxygen deficiency is decreased, whereby the electron carrier concentration can be reduced.

Meanwhile, oxygen-containing radicals or oxygen radicals can be formed easily by a radical generating apparatus.

When the crystalline oxide 2021 is formed into a film, the film-forming temperature may be 150° C. or more and 350° C. or less, more preferably 150° C. or more and 250° C. or less. With this temperature range, a film of the crystalline oxide 2021 can be formed without fail, and the thermal deformation or the like of the glass substrate 2010 can be suppressed.

The reason therefor is that, if the film-forming temperature is less than 150° C., a sufficiently crystallized crystalline indium oxide cannot be obtained, and amorphous indium oxide is obtained. As a result, there may be a case where an oxide film with a predetermined electron carrier density cannot be obtained. However, even in such a case, by conducting crystallization by a heat treatment, the crystalline oxide 2021 with a desired carrier density can be obtained. In addition, as the glass substrate 2010, various kinds of glass can be used. The reason is that, even in the case of glass with a low thermal deformation temperature (soda lime glass or the like), the thermal deformation temperature thereof is about 350° C.

In this embodiment, the crystalline oxide 2021 is formed into a film by the sputtering method. By using the sputtering method, mass productivity can be improved.

The film-forming method is not restricted to the above-mentioned sputtering method. For example, the ohmic-resistance deposition method, the electron beam deposition method, the chemical vapor deposition method, the line beam laser deposition method, the electric deposition method or the like may be used.

The crystalline oxide 2021 contains In (indium) and is used as an active layer. The electron carrier concentration of the crystalline oxide 2021 is less than $10^{18}/cm^3$. The reason that the electron carrier concentration of the crystalline oxide 2021 is allowed to be less than $10^{18}/cm^3$ is as follows. If an oxide with an electron carrier concentration of $10^{18}/cm^3$ or more is used as the active layer of the field-effect thin film transistor 2001, the on-off ratio cannot be increased sufficiently, and a large amount of current is flown between the source electrode 2022 and the drain electrode 2023 even when no gate voltage is applied to the field-effect thin film transistor 2001, whereby no normally-off operation can be realized.

The electron carrier concentration of the crystalline oxide 2021 according to the present invention is a value measured at room temperature. The room temperature is, for example, 25° C. Specifically, it is a temperature which can be appropriately selected from a range of about 0 to 40° C. The electron carrier concentration of the crystalline oxide film 2021 according to the present invention does not necessarily fall within the above-mentioned range in the entire temperature range of about 0 to 40° C. For example, it suffices that a carrier electron concentration of less than about $10^{18}/cm^3$ be realized at about 25° C. It is preferred that the carrier electron concentration be further lowered to $10^{17}/cm^3$ or less, more preferably to $10^{16}/cm^3$ or less. In this way, a normally-off field-effect thin film transistor 2001 can be obtained in a high yield.

The lower limit of the electron carrier concentration of the crystalline oxide 2021 is not particularly limited insofar as it can be applied as the active layer of a transistor. Therefore, in the present invention, by controlling the material, composition ratio, production conditions, post-treatment conditions, or the like of the crystalline oxide, the electron career concentration is allowed to be $10^{12}/cm^3$ or more and less than $10^{18}/cm^3$. Moreover, it is preferred that the electron carrier concentration be $10^{13}/cm^3$ or more and less $10^{17}/cm^3$ or less, further preferably $10^{15}/cm^3$ or more and $10^{16}/cm^3$ or less. With this range, it is possible to obtain a normally-off field-effect thin film transistor 2001 having a predetermined electron mobility in a high yield.

The electron carrier concentration is measured by the Hall effect measurement. It is preferred to perform the AC Hall measurement when measuring the electron carrier concentration of less than about $10^{17}/cm^3$. The reason therefor is that, in the DC Hall measurement, there is a large degree of variation in measurement values, which may cause measurement reliability to be deteriorated.

The active layer of the field-effect thin film transistor 2001 (semiconductor thin film) is a thin film containing a crystalline substance (that is, the crystalline oxide 2021). As for the crystalline oxide 2021, at least part or all of the semiconductor thin film is crystalline. As a result, as compared with the case where the semiconductor thin film is amorphous, the carrier concentration can be decreased or controlled easily, and the operation of the field-effect thin film transistor 2001 becomes stable. As a result, the performance of a transistor such as electrical characteristics, stability, uniformity, reproducibility, heat resistance, durability or the like can be improved.

The crystalline substance to be contained in the thin film may be either mono-crystalline or polycrystalline (including an epitaxial film). A polycrystalline film which is easily manufactured on the industrial basis and can contribute to an increase in area is preferable. A polycrystal is preferable, since a single crystal may have cracks by bending or impact during the production process or impact.

In the present invention, the crystalline oxide 2021 means an oxide exhibiting a specific diffraction pattern in the X-ray diffraction spectrum. On the other hand, an amorphous oxide means an oxide which shows a harrow pattern and does not exhibit a specific diffraction pattern.

Furthermore, it is preferred that the energy band gap between the conduction band and the valence band of the semiconductor thin film according to the present invention be about 2.8 eV or more. Due to such a band gap, a disadvantage that electrons of the valence band are excited by the irradiation of visible rays to allow a leak current to be flown easily can be effectively avoided.

Further, it is preferred that the above-mentioned crystalline oxide 2021 be a nondegenerate semiconductor.

In this way, the off-current can be rendered small and the on/off ratio can be increased.

The above-mentioned crystalline oxide 2021 contains a positive divalent element.

Due to the presence of a positive divalent element, the electron carrier concentration can be decreased by the effect of extinguishing carriers generated by oxygen deficiency. In addition, as known in ITO or the like, the mean free path of the carrier is smaller than the size of crystal particles in the crystalline state. Therefore, the mean free path of the carrier does not depend on the size of crystal particles. Therefore, the crystalline oxide 2021 can be a crystalline thin film with a high electron mobility. Further, in indium oxide, since the element added is a positive divalent metal element, this positive divalent metal element and oxygen undergo ionic bonding. Therefore, the oxide of the positive divalent element does not become a career scattering factor, and hence, the electron mobility can be kept high.

Moreover, although being inferior to the electron mobility of a thin film formed of a mono-crystalline oxide, the electron mobility of a thin film formed of this polycrystalline oxide 2021 is large. Furthermore, the thin film which is formed of the crystalline oxide 2021 can be more stabilized by containing a positive divalent element. Moreover, the field-effect mobility can be high, and the composition range for a stable crystalline oxide can be expanded.

Here, the positive divalent element means an element which can have two positive valences as the valence in the ionic state, and the positive trivalent element means an element which can have three positive valences as the valence in the ionic state.

Further, it is preferred that the above-mentioned positive divalent element be at least one element selected from Zn, Mg, Ni, Co and Cu.

In this way, at least part of the positive divalent element such as Zn solid-solution-substitutes indium, whereby the electron carrier concentration can be effectively reduced. Here, there is no particular restriction of the solid-solution-substituted amount of a metal added such as Zn. It suffices that even part of the metal be solid-solution-substituted. The crystalline oxide 2021 may be an oxide mixture.

Moreover, Zn and other divalent Mg, Ni, Co and Cu may be added simultaneously. For example, when adding Zn and Mg simultaneously, the electron mobility increases as compared with the case where Zn is added alone. The amount of this increase is about $10\,cm^2/(V \cdot sec)$ in the case of electron mobility at room temperature, which is an increase by one figure or more. Furthermore, since electric resistivity also increases and the electron mobility decreases with an increase in Mg content when a film is formed under the same conditions, the content of the positive divalent elements which consist of Zn and Mg is preferably larger than 0.5 at % and less than 10 at % relative to all metal atoms. The reason therefor is as follows. If the content is 0.5 at % or less, no improvement in electrical resistance is found even if the film is crystallized. If the content is 10 at % or more, the film is hard to be crystallized, and as a result, a need arises that the crystallization temperature is set high, resulting in larger energy consumption, which is economically disadvantageous.

That is, it is preferred that the atomic ratio of the number of the atoms of the positive divalent element ([M2]) to the number of the atoms of all metal elements contained in the crystalline oxide 2021 ([A]) be $$0.005 < [M2]/[A] < 0.1.$$

With this range, a more stable crystalline oxide can be obtained. In addition, the electronic career concentration can be controlled to less than $10^{18}/cm^3$.

Moreover, it is more preferred that $0.01 \leq [M2]/[A] < 0.08$. In addition, even if Mg is selected instead of Zn, for example, almost similar results can be obtained. That is, Zn, Mg, Ni, Co and Cu exhibit almost similar effects.

In the above-mentioned statement, the amount of careers generated by oxygen deficiency is controlled by the added amount of the divalent metal elements contained in the crystalline oxide 2021. That is, oxygen deficiency of the crystalline oxide 2021 is controlled (normally decreased) by adding a divalent metal element (and/or a trivalent metal element mentioned later), and further by crystallizing the indium oxide film during or after film formation in an atmosphere containing oxygen and/or water to allow it to be reacted with oxygen to further control (normally decrease) the amount of oxygen deficiency. In this way, due to the effects of extinguishing carriers generated by oxygen deficiency, the electron carrier concentration is reduced, whereby the field-effect thin film transistor 2001 can have normally-off properties.

The above-mentioned crystalline oxide 2021 may contain, instead of a positive divalent element, a positive trivalent element which is different from indium.

In this way, the electron carrier concentration can be decreased by the effect of distinguishing carriers generated by oxygen deficiency. Moreover, although being inferior to the electron mobility of a thin film formed of a mono-crystalline oxide, the electron mobility of a thin film formed of this polycrystalline oxide 2021 is large. Furthermore, the thin film which is formed of the crystalline oxide 2021 can be more stabilized by containing a positive trivalent element. Moreover, the field-effect mobility can be high, and the composition range for a stable crystalline oxide can be expanded. Further, in indium oxide, since the element added is a positive trivalent metal element, this positive trivalent metal element and oxygen undergo ionic bonding. Therefore, the oxide of the positive trivalent element does not become a career scattering factor, and hence, the electron mobility can be kept high.

Moreover, it is preferred that the above-mentioned positive trivalent element be at least one element selected from B, Al, Ga, Sc, Y and a lanthanoid element.

In this way, the crystalline oxide 2021 is stably crystallized due to a strong ionic bonding of B, Al, Ga, Sc, Y and a lanthanoid element. In addition, in a composite indium oxide formed of ions of which the difference in ionic radius among the ions is small, the crystalline phase is more stabilized. For example, in the case of an In-lanthanoid element-oxygen-based crystalline oxide 2021, the ionic radius decreases such that it becomes closer to the ionic radius of indium with an increase in the atomic number of a lanthanoid element. As a result, it is difficult to obtain a crystalline indium film which can be stably heat-treated in the case of an ion with a small atomic number. It is preferred that the content of a lanthanoid element be 0.5 at % to 5 at % to the number of the atoms of all metal elements. With this range, a stable crystalline film can be obtained. In addition, in the case of an ion with a large atomic number, a crystalline indium oxide film which can be stably heat-treated can be obtained easily, whereby a significantly stable crystalline film can be obtained.

Further, B, Al, Ga, Sc, Y and a lanthanoid element strongly bonds with oxygen (the work function of the metal is smaller than that of In), and hence, it hardly suffers oxygen deficiency when crystallized. Therefore, generation of carriers derived from oxygen deficiency can be suppressed effectively.

As mentioned above, it is preferred that the atomic ratio of the number of the atoms of the positive trivalent element ([M3]) to the number of the atoms of all metal elements contained in the crystalline oxide 2021 ([A]) be $$0.005 < [M3]/[A] < 0.05.$$

The reason therefor is that, if the atomic ratio is 0.5 at % or less, the effect of addition may not be obtained. If the atomic ratio is 5 at % or more, the crystallization temperature becomes too high to be practical.

In this way, it is possible to obtain a more stable crystalline oxide, and the electron carrier concentration can be controlled to less than $10^{18}/cm^3$.

The similar effects can be obtained if Y is selected instead of B. B, Al, Ga, Sc, Y and a lanthanoid element exhibit almost the similar effects.

The method is not limited to a method in which either one of the above-mentioned positive divalent element and the above-mentioned positive trivalent element is contained. For example, both the above-mentioned positive divalent element and the above-mentioned positive trivalent element may be contained. Due to the presence of the positive divalent element and the positive trivalent element, generation of carriers can be prevented further effectively. That is, if a positive divalent element is contained, the electron carrier concentration can be reduced effectively by the effect of distinguishing carriers generated by oxygen deficiency. Further, if a positive trivalent element different from indium is contained, oxygen deficiency hardly occurs, and generation of carriers derived from oxygen deficiency can be effectively suppressed. Although being lower than the electron mobility of a thin film formed of a mono-crystalline oxide, a thin film formed of the polycrystalline oxide 2021 can have a large degree of electron mobility.

It is preferred that the atomic ratio of the number of the atoms of the positive divalent element
([M2]) to the number of the atoms of all metal elements contained in the crystalline oxide 2021 ([A]) and the atomic ratio of the number of the atoms of the positive trivalent element different from indium ([M3]) to the number of the atoms of all metal elements contained in the crystalline oxide 2021 ([A]) be $$0.005 < [M2]/[A] < 0.1$$

$$0.005 < [M3]/[A] < 0.05.$$

With this range, a more stable crystalline oxide can be obtained. In addition, the electron carrier concentration can be controlled to less than $10^8/cm^3$.

The film-forming example of the crystalline oxide 2021 will be explained later.

Next, as shown in FIG. 11(c), on the crystalline oxide 2021, a Mo/Al/Mo thin film which is to be the source electrode 2022 and the drain electrode 2023 is deposited. The film is then patterned to form a source electrode 2022 and a drain electrode 2023 (Step S2003).

Here, the Mo/Al/Mo thin film is patterned by an aqueous solution composed of phosphoric acid, acetic acid and nitric acid (appropriately abbreviated as PAN). That is, since the crystalline oxide 2021 has a PAN resistance, the source electrode 2022 and the drain electrode 2023 are selectively formed.

Then, as shown in FIG. 11(d), a gate-insulating film 2024 is formed on the glass substrate 2010, the crystalline oxide 2021, the source electrode 2022 and the drain electrode 2023 (Step S2004). The gate-insulating film 2024 is composed of an oxide such as $Y_2O_3$, $HfO_2$, $SiO_2$, SiNx and $Al_2O_3$, a mixed compound containing two or more thereof, or the like.

If any defect presents at the interface between the gate-insulating film 2024 and the crystalline oxide 2021 (active layer), the electron mobility lowers and hysteresis occurs in transistor properties. A leak current greatly changes depending on the type of the gate-insulating film 2024. Therefore, a gate-insulating film 2024 suitable for an active layer is required to be selected. If using an $Al_2O_3$ film, leak current can be reduced. If using an $SiO_2$ film, the degree of hysteresis can be rendered small. Further, by using an SiNx film with a high dielectric constant, a field-effect mobility can be increased. Further, by using a film containing a mixture of these compounds, the field-effect thin film transistor 2001 can have a reduced leak current, a small degree of hysteresis and a high degree of field-effect mobility.

If the gate-insulating film 2024 composed of an oxide is formed, it is preferred that the film formation be conducted in an atmosphere containing oxygen and/or water. In this way, the insulating properties of the gate-insulating film 2024 can be improved.

Then, as shown in FIG. 11(e), a Mo/Al/Mo thin film is deposited on the gate-insulating film 2024 above the crystalline oxide 2021 which is to be the active layer, and the film is then patterned to form a gate electrode 2025 (Step S2005). In the drawing, the Mo/Al/Mo thin film is not distinguished.

Although not shown, in the source electrode 2022 and the drain electrode 2023, a pad for connecting with an external terminal is formed.

As explained hereinabove, according to the method for producing the field-effect transistor 2001 in this embodiment, as the active layer, the crystalline oxide 2021 which contains a positive divalent element and/or a positive trivalent element different from indium is formed in an atmosphere containing oxygen and/or water. As a result, it is possible to obtain a field-effect thin film transistor 2001 which has transistor properties that the on-off ratio exceeds $10^3$ in a normally-off state in which a gate current of less than 0.1 μA is flown with the transistor being off. Further, since the active layer is formed of the crystalline oxide 2021, stability, uniformity, reproducibility, heat resistance, durability or the like can be improved.

[Second Embodiment of the Method for Producing a Field-effect Transistor]

Figure 12:
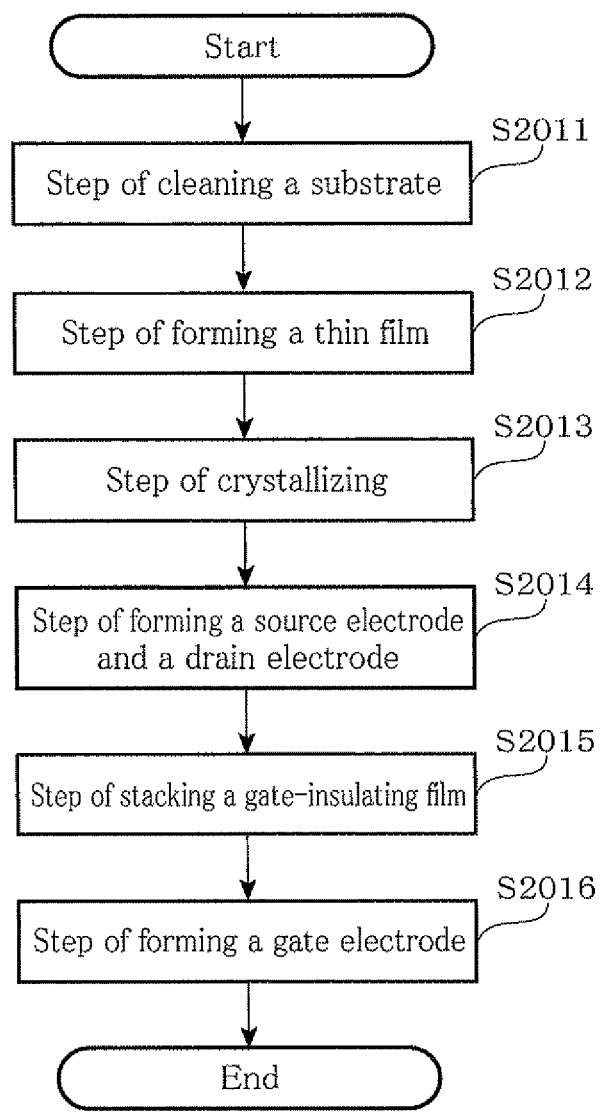
FIG. 12 is a schematic flow chart for explaining the method for producing a field-effect thin film transistor according to the second embodiment of the present invention.

FIG. 12 is a schematic flow chart for explaining the method for producing a field-effect thin film transistor according to the second embodiment of the present invention.

Figure 13:
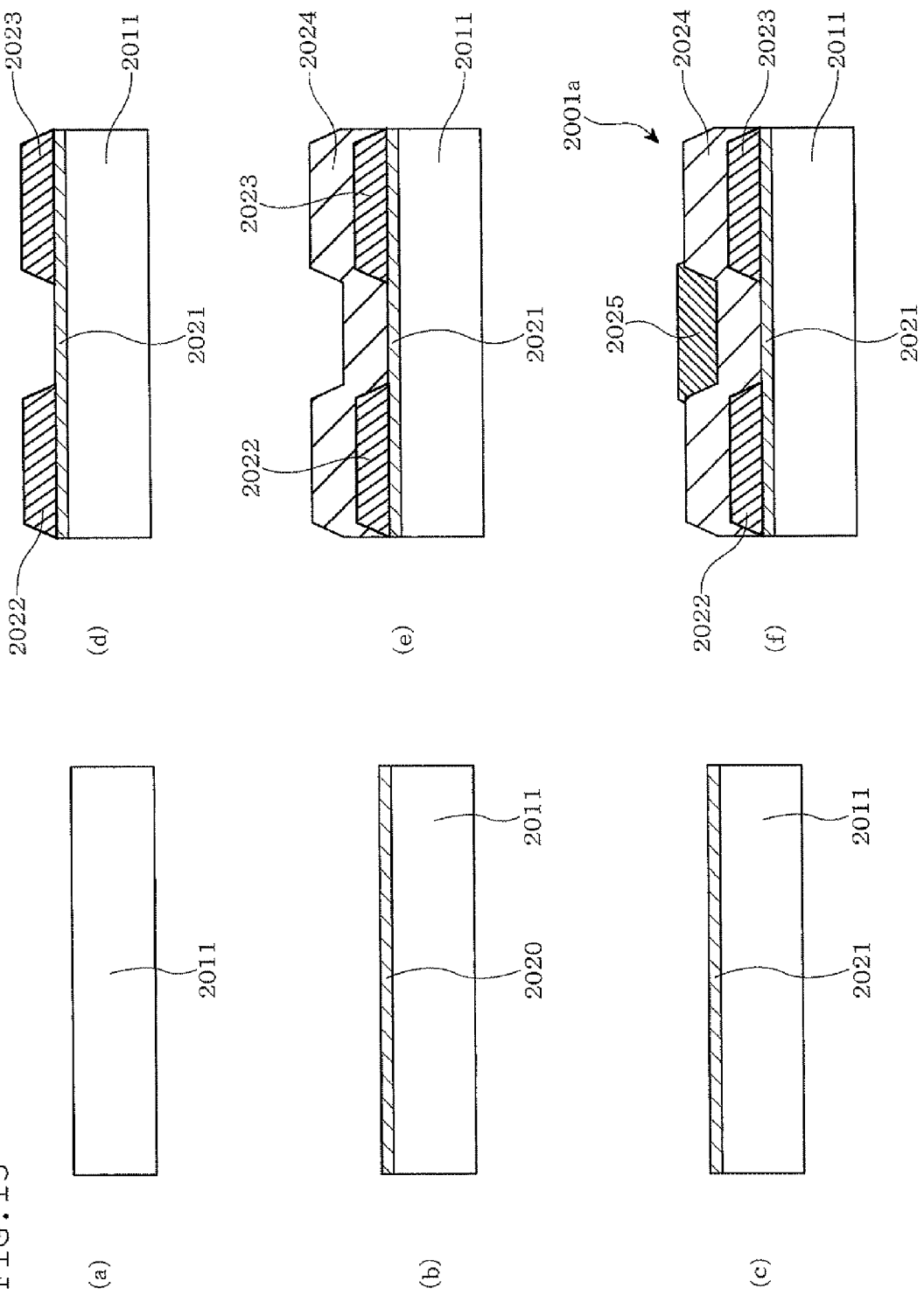
FIG. 13 is a schematic view of essential parts for explaining the method for producing a field-effect thin film transistor according to the second embodiment of the present invention, in which (a) is a cross-sectional view of a substrate which has been cleaned, (b) is a cross-sectional view showing the state in which an amorphous oxide to be served as an active layer is formed into a film, (c) is a cross-sectional view showing the state in which the crystalline oxide as the active layer is formed, (d) is a cross-sectional view showing the state in which a source electrode and a drain electrode are formed, (e) is a cross-sectional view showing the state in which a gate-insulating film is stacked and (f) is a cross-sectional view showing the state in which a gate electrode is formed.

FIG. 13 is a schematic view of essential parts for explaining the method for producing a field-effect thin film transistor according to the second embodiment of the present invention, in which (a) is a cross-sectional view of a substrate which has been cleaned, (b) is a cross-sectional view showing the state in which an amorphous oxide to be served as an active layer is formed into a film, (c) is a cross-sectional view showing the state in which the crystalline oxide as the active layer is formed, (d) is a cross-sectional view showing the state in which a source electrode and a drain electrode are formed, (e) is a cross-sectional view showing the state in which a gate-insulating film is stacked, and (f) is a cross-sectional view showing the state in which a gate electrode is formed.

In FIG. 12 and FIG. 13(a), at first, the film substrate 2011 is prepared. In almost the same production method as in the first embodiment, this film substrate 2011 is cleaned (Step S2011). In this way, contaminants which have been adhered to the surface of the film substrate 2011 are removed, whereby the surface is cleaned. As a result, a disadvantage that the impurities scatter over the crystalline oxide 2021 which is to be deposited on the film substrate 2011 to cause the performance to deteriorate can be prevented. In addition, due to the cleaning of the surface, adhesion of the crystalline oxide 2021 is improved.

The film substrate 2011 in this embodiment is a film formed of polyethylene terephthalate, or the like, and has flexibility. The film substrate 2011 may be hard-coated in advance with a siloxane-based condensation product.

When the film substrate 2011 is formed of polyethylene terephthalate, in order to avoid thermal deformation, the film substrate 2011 is normally allowed to be 180° C. or less.

Then, as shown in FIG. 13(b), on the film substrate 2011, an amorphous oxide 2020 which is to be the active layer (oxide thin film) is formed at room temperature (about 25° C.) in an atmosphere containing oxygen and/or water (Step S2012). That is, by the sputtering method, on the transparent film substrate 2011, an amorphous oxide 2020 (using a target containing 5 wt % of zinc oxide and 95 wt % of indium oxide in substantially the same production method in the first embodiment) is formed.

Then, as shown in FIG. 13(*c*), by the treatment of irradiating an oxygen-containing low-temperature plasma in an atmosphere containing oxygen and/or water, the amorphous oxide 2020 is crystallized to be a crystalline oxide 2021 (Step S2013). In this way, since the amorphous oxide 2020 can be crystallized at a temperature lower than the thermal deformation temperature of the film substrate 2011, it is possible to form the field-effect thin film transistor 2001 on the flexible film substrate 2011.

In this embodiment, in order to crystallize the amorphous oxide 2020, a treatment is conducted in which an oxygen-containing low-temperature plasma is irradiated. However, the crystallization method is not limited thereto. For example, a predetermined electron carrier concentration (less than $10^{18}/cm^3$) may be realized by conducting a heat treatment for crystallization in an atmosphere containing oxygen and/or water.

Oxygen plasma is easily generated by supplying an $O_2$ gas to a plasma generating apparatus (an ECR plasma generating apparatus, an RF plasma generating apparatus, a DC plasma generating apparatus or the like).

Then, as shown in FIG. 13(*d*), on the crystalline oxide 2021, a Mo/Al/Mo thin film which is to be the source electrode 2022 and the drain electrode 2023 is deposited. The film is then patterned to form a source electrode 2022 and a drain electrode 2023 (Step S2014).

Then, as shown in FIG. 13(*e*), a gate-insulating film 2024 is formed on the glass substrate 2010, the crystalline oxide 2021, the source electrode 2022 and the drain electrode 2023 (Step S2015). The gate-insulating film 2024 is composed of an oxide such as $Y_2O_3$, $HfO_2$, $SiO_2$, SiNx and $Al_2O_3$, a mixed compound containing two or more thereof, or the like.

Then, as shown in FIG. 13(*f*), a Mo/Al/Mo thin film is deposited on the gate-insulating film 2024, and the Mo/Al/Mo thin film is patterned, whereby the gate electrode 2025 is formed (Step S2016). In the drawing, the Mo/Al/Mo thin film is not distinguished.

Except for the above, the method is substantially the same as the production method in the first embodiment.

As mentioned above, according the method for producing the field-effect thin film transistor 2001*a* in this embodiment, almost similar effects as those attained by the production method in the first embodiment can be attained. Further, it is possible to produce the field-effect thin film transistor 2001*a* on the film substrate 2011 having flexibility.

In the meantime, the plasma irradiation may be conducted while heating the film substrate 2011.

[Third Embodiment of the Method for Producing a Field-effect Transistor]

Figure 14:
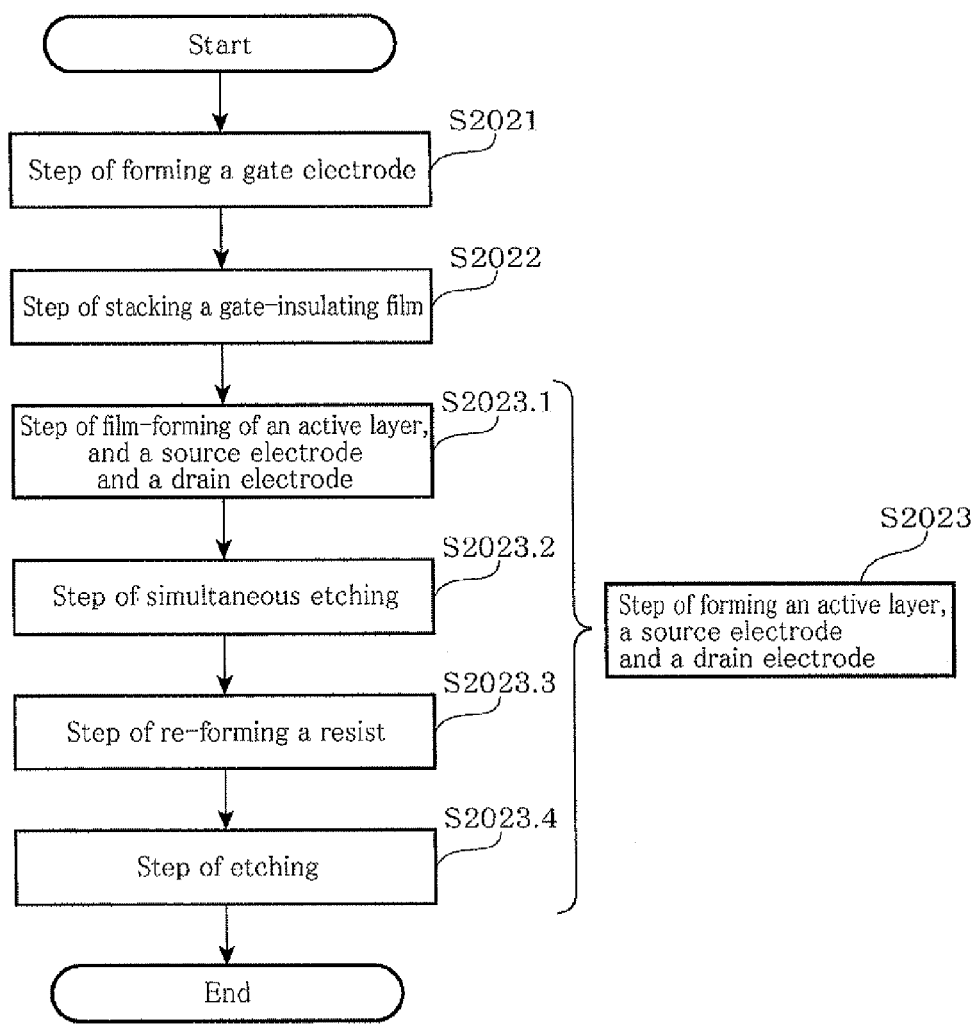
FIG. 14 is a schematic flow chart for explaining the method for producing a field-effect thin film transistor according to the third embodiment of the present invention.

FIG. 14 is a schematic flow chart for explaining the method for producing a field-effect thin film transistor according to the third embodiment of the present invention.

Figure 15:
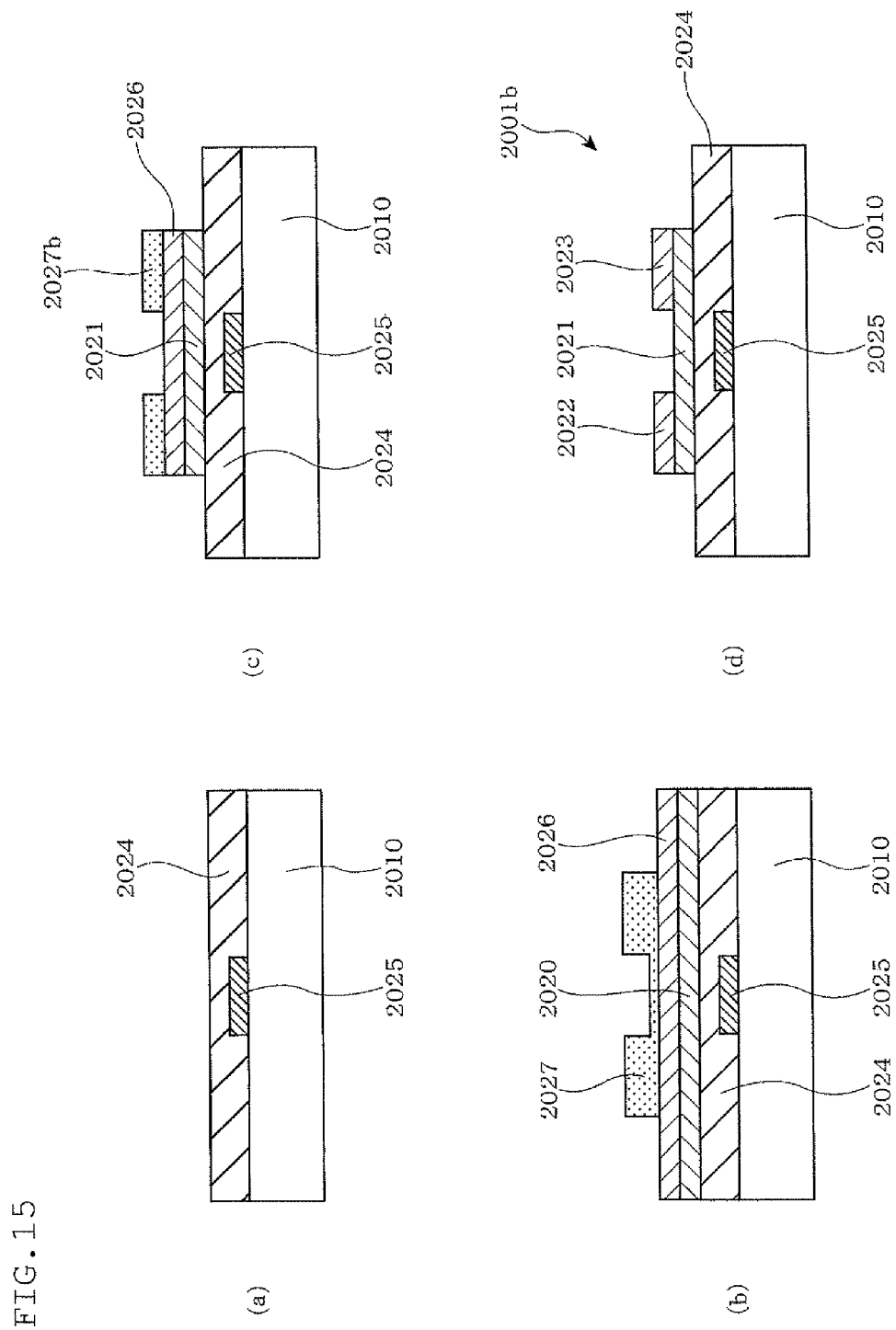
FIG. 15 is a schematic view of essential parts for explaining the method for producing a field-effect thin film transistor according to the third embodiment of the present invention, in which (a) is a cross-sectional view of a substrate on which a gate electrode and a gate-insulating film are formed, (b) is a cross-sectional view showing the state in which an active layer and a conductor layer are formed into a film and a resist is formed by a half-tone mask, (c) is a cross-sectional view showing the state in which the active layer and the conductor layer are etched and the resist is re-formed, and (d) is a cross-sectional view showing the state in which a source electrode and a drain electrode are formed.

FIG. 15 is a schematic view of essential parts for explaining the method for producing a field-effect thin film transistor according to the third embodiment of the present invention, in which (a) is a cross-sectional view of a substrate on which a gate electrode and a gate-insulating film are formed, (b) is a cross-sectional view showing the state in which an active layer and a conductor layer are formed into a film and a resist is formed by a half-tone mask, (c) is a cross-sectional view showing the state in which the active layer and the conductor layer are etched and the resist is re-formed, and (d) is a cross-sectional view showing the state in which a source electrode and a drain electrode are formed.

In FIGS. 14 and 15(*a*), at first, the glass substrate 2010 is prepared. Then, a Mo/Al/Mo thin film is deposited on the glass substrate 2010, and the Mo/Al/Mo thin film is then patterned, whereby the gate electrode 2025 is formed (Step S2021). In the drawing, the Mo/Al/Mo thin film is not distinguished. Subsequently, the gate-insulating film 2024 is formed on the glass substrate 2010 and the gate electrode 2025 (Step S2022). This gate-insulating film 2024 is composed of an oxide such as $Y_2O_3$, $HfO_2$, $SiO_2$, SiNx and $Al_2O_3$, a mixed compound containing two or more thereof, or the like.

Then, as shown in FIG. 15(*b*), on the glass substrate 2010, an amorphous oxide 2020 (oxide thin film) which is to be an active layer is formed at room temperature (about 25° C.) in an atmosphere containing oxygen and/or water (thin film-forming step). Subsequently, a conductor layer 2026 which is to be the source electrode 2022 and the drain electrode 2023 is formed (Step S2023. 1). Further, by means of a half-tone mask (not shown), a resist 2027 is formed. This resist 2027 has a shape such that it covers the source electrode 2022, the drain electrode 2023 and the active layer (the crystalline oxide 2021 positioned above the gate electrode 2025). The part of the resist 2027 which covers the active layer is formed thinner than other parts.

The conductor layer 2026 is formed of the Mo/Al/Mo thin film from which the source electrode 2022 and the drain electrode 2023 are formed.

Then, as shown in FIG. 15(*c*), the conductor layer 2026 and the amorphous oxide 2020 are simultaneously etched by using a PAN-based etching solution (Step S2023.2). Subsequently, by dry etching, the resist 2027 is etched in a predetermined thickness, and a re-formed resist 2027*b* is formed such that the active layer is exposed (Step S2023.3). Further, the amorphous oxide 2020 is subjected to a heat treatment at a temperature of 150° C. or more and 350° C. or less in an atmosphere containing oxygen and/or water, whereby the oxide 2020 becomes the crystalline oxide 2021 as the active layer (crystallization step). As a result, the crystalline oxide 2021 can have a PAN resistance.

Then, as shown in FIG. 15(*d*), the conductor layer 2026 is etched with a PAN-based etching solution (Step S2023.4), whereby the crystalline oxide 2021 is exposed. As a result, the crystalline oxide 2021 as the active layer, the source electrode 2022 and the drain electrode 2023 are formed (Step S2023).

Except for the above, the method is substantially the same as the production method in the first embodiment.

As mentioned above, according to the method for producing the field-effect transistor 2001 b in this embodiment, almost similar effects as those attained by the production method in the first embodiment can be attained. Further, the degree of freedom of process design is increased. That is, normally, since the amorphous oxide 2020 is soluble in a PAN-based etching solution, it can be etched simultaneously with the conductor layer 2026, whereby productivity can be improved.

In addition, the above-mentioned crystalline oxide 2021 containing a positive divalent element and a positive trivalent element is formed, for example, by the sputtering method.

Next, an explanation is made on the Film-forming Example 3 of a thin film composed of the crystalline oxide 2021.

FILM-FORMING EXAMPLE 3

In this film formation method, it is preferable to use the vapor phase deposition method which uses, as a target, an indium oxide polycrystalline sintered body with a composition of $In_2O_3(ZnO)_m$ (wherein m is an integer of 2 to 20). Of the vapor deposition methods, the sputtering method and the pulse laser deposition method are suitable. The sputtering method is most suitable in view of mass productivity.

However, if the amorphous film is formed under normal conditions, oxygen deficiency mainly occurs. Therefore, it has been impossible to allow the electron carrier concentration to be less than $10^{18}/cm^3$, which means an electrical resistance of $10^2 \Omega cm$ or more. If such a film is used, a normally-off transistor cannot be configured.

Figure 16:
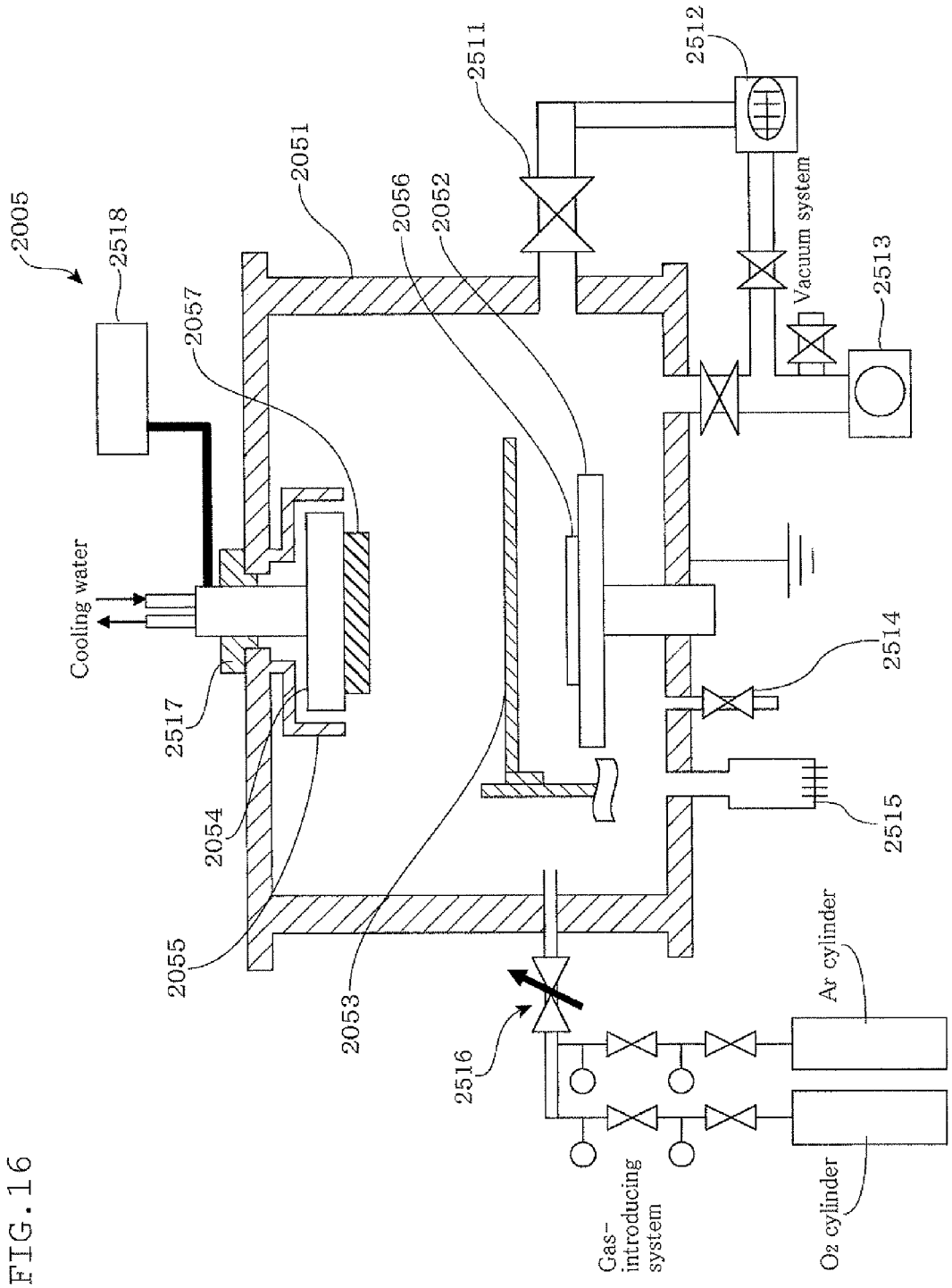
FIG. 16 is a schematic view of the sputtering apparatus by which the crystalline oxide according to Film-forming Example 3 and Film-forming Example 4 is formed.

Therefore, the inventors prepared an amorphous zinc oxide-containing indium oxide by the sputtering method using the sputtering apparatus shown in FIG. 16. Then, the indium oxide was crystallized by heating in an atmosphere containing oxygen and/or water.

FIG. 16 is a schematic view of the sputtering apparatus by which the crystalline oxide according to Film-forming Example 3 and Film-forming Example 4 was produced.

In a sputtering apparatus 2005 shown in FIG. 16, in a film-forming chamber (chamber) 2051, a substrate holder 2052 with cooling and heating mechanisms, a shutter 2053, an electrode 2054 and a shield 2055 are provided. Further, a main valve 2511, a turbo molecular pump 2512, an oil rotating pump 2513, a leak valve 2514, a vacuum meter 2515 or the like for making the inside of the film-forming chamber 2051 vacuum are provided. Further, an oxygen gas or an Ar gas is supplied to the film-forming chamber 2051 through the variable leak valve 2516. The electrode 2054 is attached to the film-forming chamber 2051 through an insulator 2517. Electric power is supplied to the electrode from a DC power supply, and the electrode 2054 is further cooled with cooling water. Further, a substrate 2056 is installed on the substrate holder 2052, and a target 2057 is attached to the electrode 2054.

By the sputtering method, an amorphous zinc oxide-containing indium oxide film was deposited on a $SiO_2$ glass substrate (1737 manufactured by Corning, Inc.). The amorphous film was then subjected to a heat treatment in the air at 300° C. for 1 hour, whereby a crystalline indium oxide film (crystalline oxide 2021) was obtained. As a treatment before the deposition, cleaning of the substrate was conducted by means of an ultrasonic wave. That is, the substrate was washed with an aqueous solution containing hydrogen peroxide and ammonia and ultrapure water for about 5 minutes each, followed by drying at 100° C. in the air.

Further, as the polycrystalline target, an indium oxide polycrystalline target (size: 4 inches in diameter and 5 mm in thickness) containing $In_2O_3(ZnO)_4$ was used. As the starting material of this target, $In_2O_3$:$ZnO_4$ (each 4N reagent) was used. Further, the starting material was subjected to wet blending (solvent: ethanol), dry-granulating with a spray dryer, molding by means of a single-axis pressing machine, molding by cold isostatic pressing and sintering (36 hours at 1450° C.). The thus produced target had a bulk resistance of 0.005 ($\Omega cm$) or less and was excellent in conductivity. As a result, film formation by the RF sputtering method and the DC sputtering method becomes possible.

The film formation was conducted in the state where the ultimate vacuum of the sputtering chamber was allowed to be $5 \times 10^{-4}$ Pa, the oxygen concentration during sputtering was controlled to 3%, and the total pressure was allowed to be 0.3 Pa with an argon gas.

The oxygen partial pressure within the sputtering chamber was 0.009 Pa and the substrate temperature was room temperature.

The distance between the target and the film-forming substrate was 80 mm and the power of the DC sputtering was in the range from 100 W to 200 W.

For the thus obtained thin film, grazing incidence X-ray diffraction (the thin film method, incidence angle: 0.5 degree) of the thin film was performed. No clear diffraction peak was observed. The zinc oxide-containing indium oxide thin film immediately after the production was amorphous.

After a heat treatment at 200° C. in the air for 1 hour, the thin film was subjected to grazing incidence X-ray diffraction (the thin film method, incidence angle: 0.5 degree). A clear diffraction peak appeared, which was revealed to be derived from the bixbite structure of crystalline indium oxide. The obtained thin film was crystalline indium oxide.

Furthermore, as a result of an X-ray reflectance measurement to analyze the pattern, the average root mean square resistance (Rrms) of the thin film was about 0.8 nm, and the film thickness was about 100 nm. As a result of the analysis by the ICP method, the atomic ratio of the number of the atoms of Zn ([Zn]) to the number of the atoms of all metal elements contained in the crystalline oxide ([A]) [Zn]/[A] was found to be 0.08. In this film-forming example, [A] was equal to [In]+[Zn]. In addition, [In] is the number of the atoms of In contained in the crystalline oxide.

The specific resistance was about $10^4$ $\Omega cm$ or more. The electric career concentration was about $10^{16}/cm^3$ or less and the electron mobility was presumed to be about 5 $cm^2/(V \cdot sec)$.

From the analysis of a light absorption spectrum, the forbidden band energy width of the thus obtained amorphous thin film was found to be about 3.5 eV. From the above, it was understood that the thus prepared crystalline indium oxide-based thin film was a transparent flat thin film which had a bixbite crystalline phase, suffered less oxygen deficiency and had a large electric resistance.

(Measurement Results Relating to the Crystallization Temperature and the Electron Carrier Concentration of the Crystalline Oxide)

Figure 17:
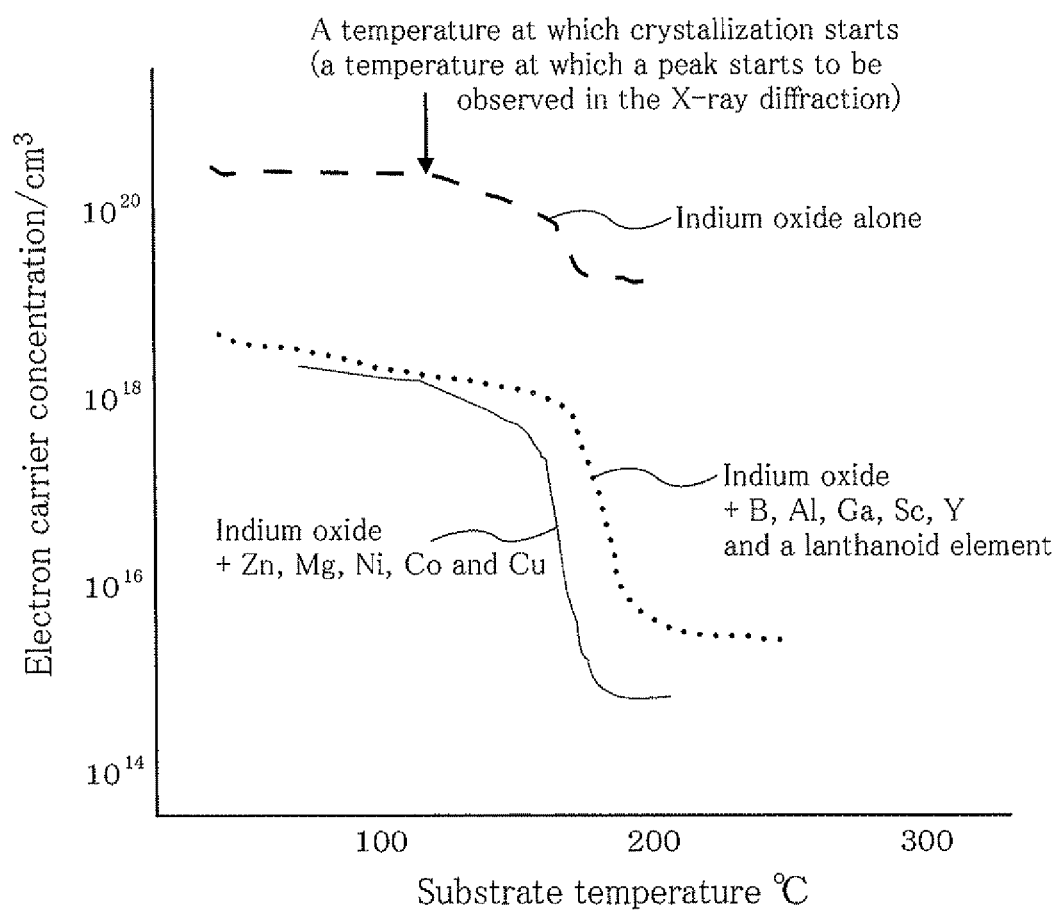
FIG. 17 is a graph of the crystallization temperature and the electron career concentration of the crystalline oxide according to Film-forming Example 3.

FIG. 17 is a graph of the crystallization temperature (substrate temperature) and the electronic career concentration of the crystalline oxide according to Film-forming Example 3.

In FIG. 17, the thin line indicates a crystalline oxide 2021 obtained by adding to indium oxide a positive divalent element (Zn, Mg, Ni, Co and Cu, with Zn being a representative element) (hereinafter, appropriately abbreviated as the crystalline oxide indicated by the thin line). To obtain the crystalline oxide indicated by the thin line, a sputtering target was used which contains about 0.2 to 6 wt % of zinc oxide, with indium oxide being the rest. Further, a heat treatment was conducted in an atmosphere containing an ozone gas at each temperature for 1 hour. The carrier concentration was measured by the Hall measurement. Crystallinity was confirmed by the X-ray diffraction using the same sample.

Further, the dotted line indicates a crystalline oxide 2021 which is obtained by adding to indium oxide a positive trivalent element other than the above-mentioned indium (B, Al, Ga, Sc, Y, La, Nd, Sm, Eu, Gd, Dy, Ho, Er, Tm, Yb, and Lu, with Yb being as a representative example) (hereinafter, appropriately abbreviated as the crystalline oxide indicated by the dotted line). To obtain the crystalline oxide indicated by the dotted line, a sputtering target was used which contains about 0.2 to 3 wt % of ytterbium oxide, with indium oxide being the rest. Further, a heat treatment was conducted in the air at each temperature for 1 hour. The carrier concentration was measured by the Hall measurement. Crystallinity was confirmed by the X-ray diffraction using the same sample.

The thick dashed line indicates a crystalline oxide formed only of indium oxide (hereinafter, appropriately abbreviated as the crystalline oxide indicated by the dashed line).

The crystalline oxide indicated by the thin line, the crystalline oxide indicated by the dotted line and the crystalline oxide indicated by the dashed line used in the measurement were produced in substantially the same manner as in the above-mentioned Film-forming Example 3, except for the crystallization temperature or the like. The electron mobility relative to the crystallization temperature was measured.

In the case of the crystalline oxide indicated by the thin line, crystallization started at about 100° C., and the electron carrier concentration suddenly dropped at a point where the substrate temperature was about 150° C. The decrease of the electron carrier concentration stopped at a point where the substrate temperature was about 180° C. For example, the crystalline oxide indicated by the thin line had an electron carrier concentration of about $1 \times 10^{15}/cm^3$ when crystallized at a point where the substrate temperature was about 200° C. As a result of the X-ray diffraction, a clear peak was observed in an oxide which was heat-treated at a temperature higher than about 180° C., and hence, the oxide was confirmed to have a bixbite structure.

In the case of the crystalline oxide indicated by the dotted line, crystallization started at about 100° C. and the electron carrier concentration suddenly dropped at a point where the crystallization temperature was about 160° C. The decrease of the electron carrier concentration stopped at a point where the crystallization temperature was about 210° C. For example, the crystalline oxide indicated by the dotted line had an electron carrier concentration of about $2 \times 10^{15}/cm^3$ when crystallized at a point where the substrate temperature was about 250° C. As a result of the X-ray diffraction, a clear peak was observed in an oxide which was heat-treated at a temperature higher than about 210° C., and hence, the oxide was confirmed to have a bixbite structure.

On the other hand, in the case of the crystalline oxide indicated by the dashed line, crystallization started at about 100° C., the electron carrier concentration suddenly dropped at a point where the crystallization temperature was about 160° C. The decrease of the electron carrier concentration stopped at a point where the crystallization temperature was about 170° C. For example, the crystalline oxide indicated by the dashed line had an electron carrier concentration of about $10^{19}/cm^3$ even when crystallized at about 200° C., for example.

That is, the crystalline oxide indicated by the dotted line and the crystalline oxide indicated by the thin line can have an electron carrier concentration which is preferable as a semiconductor (less than about $10^{18}/cm^3$) by controlling the crystallization temperature.

The Hall measurement apparatus and the Hall measurement conditions are as follows.
[Hall Measurement Apparatus]
Resi Test 8310: manufactured by Toyo Corporation
[Measurement Conditions]
Room temperature (about 25° C.), about 0.5 [T], about $10^{-4}$ to $10^{-12}$ A, AC magnetic field Hall measurement From the above results or the like, it is understood that, in order to control the electron carrier concentration effectively, it is preferable to conduct heating at a temperature of the oxygen-containing atmosphere of 150° C. or more and 350° C. or less, preferably 150° C. or more and 300° C. or less, and further preferably 150° C. or more and 250° C. or less.

In addition, by conducting a crystallization treatment in an atmosphere containing oxygen with a predetermined concentration, crystallization can be controlled effectively.

Further, although not shown, the electron carrier concentration could be further decreased by further increasing the added amount of a positive divalent element or a positive trivalent element, by conducting film formation at high temperatures to allow crystallization to be performed easily and by conducting the heat treatment at high temperatures.

The lower limit of the electron carrier concentration in the present invention depends on the type of device, circuit or apparatus in which the resulting indium oxide film is used. However, the lower limit is $10^{14}/cm^3$, for example.

In the film formation example shown in FIG. 17, at first, an amorphous oxide 2020 is formed into a film at a low temperature in an atmosphere containing oxygen and/or water. Next, the amorphous oxide film is heated to a crystallization temperature in an atmosphere containing oxygen and/or water to obtain the crystalline oxide 2021 with a desired carrier concentration. The film formation method is not limited thereto. For example, in the film formation, an amorphous oxide is formed into a film at high temperatures to form the crystalline oxide 2021.

In addition, as long as a prescribed electron carrier concentration (less than $10^{18}/cm^3$) can be obtained, film formation may be conducted in an atmosphere which does not contain neither oxygen nor water, and the crystallization treatment after the film formation may be conducted in an atmosphere containing oxygen and/or water.
(Measurement Results Relating to the Electron Carrier Concentration and the Electron Mobility of the Crystalline Oxide)

Next, the measurement results relating to the electron carrier concentration and the electron mobility of the thus obtained crystalline oxide 2021 will be explained with reference to the drawing.

Figure 18:
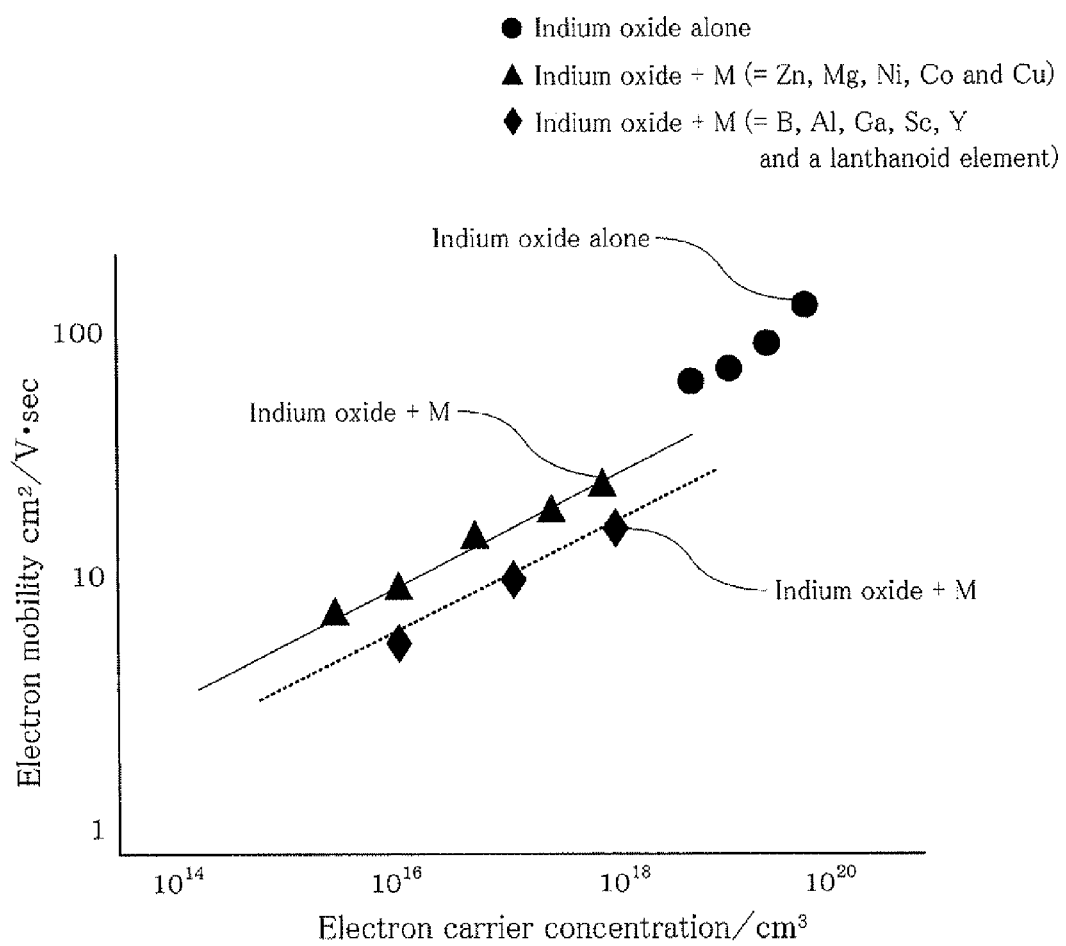
FIG. 18 is a graph of the electron carrier concentration and the electron mobility of the crystalline oxide according to Film-forming Example 3.

FIG. 18 is a graph of the crystallization temperature and the electronic career concentration of the crystalline oxide according to Film-forming Example 3.

In FIG. 18, a triangle indicates a crystalline oxide 2021 obtained by adding to indium oxide a positive divalent element (for example, Zn) (hereinafter appropriately abbreviated as the crystalline oxide indicated by the triangle).

A diamond indicates a crystalline oxide 2021 obtained by adding to indium oxide a lanthanoid element (for example, Yb) (hereinafter appropriately abbreviated as the crystalline oxide indicated by the diamond).

In addition, a circle indicates a crystalline oxide composed only of indium oxide (hereinafter appropriately abbreviated as the crystalline oxide indicated by the circle).

The crystalline oxide indicated by the diamond and the crystalline oxide indicated by the triangle were obtained by controlling the crystallization temperature or the content of a lanthanoid element and a positive divalent element. Control of the electron carrier concentration can be controlled to less than $10^{18}/cm^3$ or not depends on the conditions including the oxygen partial pressure (atmosphere containing oxygen and/or water), the heat treatment temperature, the configuration of a film-forming apparatus, the materials which are formed into a film, the composition or the like.

By controlling the production conditions (crystallization temperature, content or the like), the crystalline oxide indicated by the triangle and the crystalline oxide indicated by the diamond had an electron carrier concentration of about $10^{16}/cm^3$ to about $10^{18}/cm^3$ and had an electron mobility of several $cm^2/V \cdot sec$ to ten-odd $cm^2/V \cdot sec$.

The crystalline oxide indicated by the circle had an electron carrier concentration of about $10^{19}/cm^3$ to about $10^{20}/cm^3$ and had an electron mobility of about 100 $cm^2/V \cdot sec$. In addition, the measurement results of the crystalline oxide indicated by the triangle and the crystalline oxide indicated by the diamond were just one example. Although not shown, the crystalline oxide 2021 having improved properties could be produced by controlling the production conditions.

Normal compounds show a tendency that the electron mobility decreases with an increase in the number of electrons due to the collision of electrons. In contrast, in the case of the crystalline oxide indicated by the diamond and the crystalline oxide indicated by the triangle, the electron mobility logarithmically proportionally increases in an electron carrier concentration range of about $1 \times 10^{16}$ to $1 \times 10^{18}/cm^3$. That is, if the electron carrier concentration (X coordinate) and the electron mobility (Y coordinate) are plotted in the graph of the both logarithms, the plotted points are almost on a straight line rising from the left to the right. In addition, depending on the combination of a positive divalent element or a positive trivalent element to be contained in the crystalline oxide 2021, the plotted points form almost straight different lines rising from the left to the right.

By effectively utilizing these unique properties, the electron carrier concentration or the electron mobility can be freely set to a desired value. As a result, it is possible to provide the crystalline oxide 2021 which has more preferable semiconductor properties for various semiconductor devices. In addition, the added value of the semiconductor device can be improved.

That is, in the above-mentioned measurement examples, it is possible to allow the electron mobility of the crystalline oxide 2021 to be used as the active layer of the field-effect thin film transistor 2001 to be larger than 1 $cm^2/(V\cdot sec)$, preferably larger than 5 $cm^2/(V\cdot sec)$. As a result, the saturation current after the pinch-off can be about larger than 10 μA and the on-off ratio can be larger than about $10^3$. In addition, the electron carrier concentration is allowed to be less than $10^{18}/cm^3$, preferably less than $10^{16}/cm^3$. The current flown between the source electrode 2022 and the drain electrode 2023 in the off-state (when no gate voltage is applied) is allowed to be less than about 10 μA, preferably less than about 0.1 μA, whereby a normally-off transistor can be configured.

In the case of the field-effect thin film transistor 2001, in the pinch-off state, a high voltage is applied to the gate electrode 2025, and high-density electrons are present in the crystalline oxide 2021 as the active layer. Therefore, according to the present invention, the saturation current value can be increased in an amount corresponding to an increase in electron mobility, and almost all of the transistor properties including the on-off ratio, the saturation current and the switching speed are improved.

Meanwhile, an indium oxide ($In_2O_3$) film can be formed by the vapor phase deposition method. An amorphous film can be obtained by adding to a film forming atmosphere about 0.1 Pa of moisture. This amorphous indium oxide film is allowed to be a crystalline indium oxide by conducting a heat treatment. However, although a crystalline film can be obtained, in the case of a film composed only of $In_2O_3$, stable semiconductor properties cannot exhibited even when 30% of an oxygen gas is introduced into a film-forming atmosphere.

FILM-FORMING EXAMPLE 4

In this film-forming example, the crystalline oxide 2021 was formed by the direct current (DC) sputtering method in which an argon gas was used as an atmospheric gas. The film-forming method is not limited to the direct current (DC) sputtering method. For example, a radio-frequency (RF) sputtering method can be used.

As for the sputtering apparatus, the same sputtering apparatus as that used in the above-mentioned Film-forming Example 3 was used.

As the glass substrate 2010 for film formation, a $SiO_2$ glass substrate (1737, manufactured by Corning Inc.) was prepared. As the treatment before film formation, the glass substrate 10 was cleaned. Specifically, the substrate was cleaned with an aqueous solution containing hydrogen peroxide and ammonium, and with ultrapure water for 5 minutes each, followed by drying in the air at 100° C. It is preferable to conduct UV ozone cleaning to obtain a film improved in adhesion.

Further, as the target, an indium oxide polycrystalline sintered body (size: 4 inches in diameter and 5 mm in thickness) with a composition of $In_2O_3(ZnO)_4$ was used.

As the starting material of this target, 99 wt % $In_2O_3$:1 wt % ZnO (each 4N reagent) was used. Further, the starting material was subjected to wet blending (solvent: ethanol), dry-granulating with a spray dryer, molding by means of a single-axis pressing machine, molding by cold isostatic pressing and sintering (36 hours at 1450° C.). The specific resistance of the thus formed target was 0.005 (Ωcm).

The ultimate vacuum in the film-forming chamber 2051 was $5 \times 10^{-4}$Pa. The total pressure of an oxygen gas and an argon gas during the film formation was a fixed value in the range of 0.1 to 2.0 Pa, and was varied within an oxygen concentration range of 1 to 30% by varying the partial pressure ratio of an argon gas and oxygen.

The substrate temperature was room temperature, and the distance between the target and the film-forming substrate was 80 mm. The substrate holder 2052 was provided with a rotation mechanism, and a thin film improved in uniformity could be obtained by conducting film formation by rotating.

The input power was DC 100 W and the film-forming speed was 5 nm/mm.

For the thus-obtained thin film, the film surface was subjected to grazing incidence X-ray diffraction (the thin film method, incidence angle: 0.5 degree). No clear diffraction peak was detected, which showed that the indium oxide thin film immediately after the production was amorphous. Thereafter, the film surface of the indium oxide thin film which had been heated to 200° C. or higher was subjected to low grazing X-ray incidence diffraction (the thin film method, incidence angle: 0.5 degree). As a result, a clear diffraction peak was detected, which showed that the thin film was crystalline.

Furthermore, as a result of an X-ray reflectance measurement to analyze the pattern, the average root mean square resistance (Rrms) of the thin film was about 0.8 nm. As a result of the analysis by the ICP method, the atomic ratio of the number of the atoms of Zn ([Zn]) to the number of the atoms of all metal elements contained in the crystalline oxide ([A]) [Zn]/[A] was found to be 0.018. In this film-forming example, [A] was equal to [In]+[Zn]. In addition, [In] is the number of the atoms of In contained in the crystalline oxide. (Measurement Results Relating to the Amount Ratio of the Added Elements and the Electric Resistivity of the Crystalline Oxide)

Next, by varying the kind, composition or the like of a positive divalent element and a positive trivalent element to be added and further by controlling the production conditions, a plurality of crystalline oxides 2021 were prepared.

The results of the measurement of the amount ratio of the added elements and the electric resistivity (specific resistance) in part of these crystalline oxides 2021 will be explained with reference to the drawing.

Figure 19:
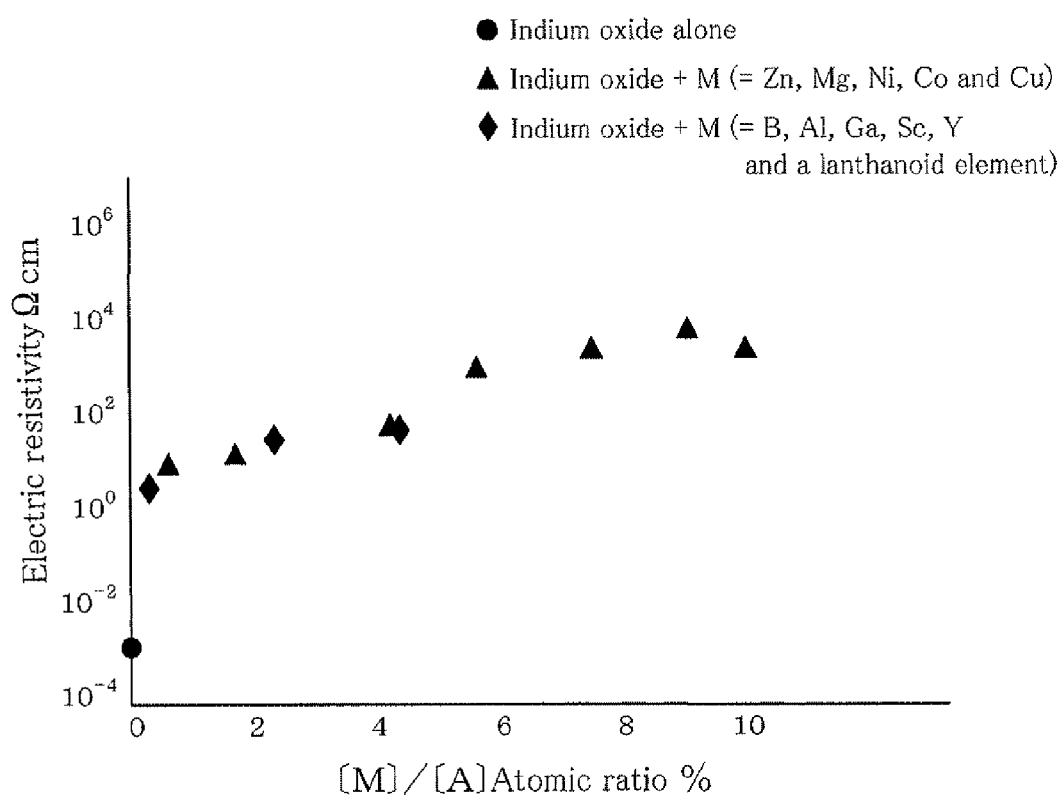
FIG. 19 is a graph of the atomic ratio of added elements and the electric resistivity in the crystalline oxide according to Film-forming Example 4.

FIG. 19 is a graph of the atomic ratio of added elements and the electric resistivity in the crystalline oxide according to Film-forming Example 4.

In FIG. 19, a triangle indicates a crystalline oxide 2021 obtained by adding to indium oxide a positive divalent element (M=at least one selected from Zn, Mg, Ni, Co and Cu) (hereinafter appropriately abbreviated as the crystalline oxide indicated by the triangle).

A diamond indicates a crystalline oxide 2021 obtained by adding to indium oxide a positive trivalent element other than the above-mentioned indium (M=at least one selected from B, Al, Ga, Sc, Y, La, Nd, Sm, Eu, Gd, Dy, Ho, Er, Tm, Yb and Lu) (hereinafter appropriately abbreviated as the crystalline oxide 2021 indicated by the diamond).

In addition, a circle indicates a crystalline oxide composed only of indium oxide (hereinafter appropriately abbreviated as the crystalline oxide indicated by the circle).

The crystalline oxide indicted by the triangle had an electrical resistivity was about $10^1$ Ωcm to $10^4$ 106 cm when the atomic ratio of the number of the atoms of an added positive divalent element M ([M]) to the number of the atoms of all metal elements contained in the crystalline oxide 2021 ([A]) ([M]/[A]) was about 0.6% to 9.7%. That is, by adding a slight amount of a positive divalent element M, the electric resistivity was increased to about $10^1$ Ωcm or more. In addition, by further increasing the atomic ratio %, the electric resistivity could be further improved. For example, in the case of an amorphous indium oxide thin film containing 8.8 at % of zinc which is prepared at a substrate temperature of 25° C. and an oxygen partial pressure of 3%, the electric resistivity could be increased to about $10^4$ Ωcm by heating and crystallizing in an atmosphere containing oxygen and/or water.

In addition, in the case of the crystalline oxide indicated by the diamond, the electric resistivity was about several Ωcm to several tens Ωcm when the atomic ratio of the number of the atoms of an added positive trivalent element M ([M]) to the number of the atoms of all metal elements contained in the crystalline oxide 2021 ([A]) ([M]/[A]) was about 0.3% to 4.2%.

The crystalline oxide 2021 indicated by the circle had an electric resistivity of about $10^{-3}$ Ωcm.

From the above measurement results, in the crystalline oxide 2021, it is preferred that the zinc content be larger than about 0.1 at %, preferably about larger than 0.5 at %, and about 12 at % or less, preferably about 10 at % or less. In addition, it is preferred that the crystalline oxide 2021 have a bixbite structure of indium oxide as the crystal structure in the crystalline state and be a transparent crystalline indium oxide thin film. By using this transparent crystalline indium oxide thin film in the field-effect thin film transistors 2001, 2001a and 2001b, a normally-off transistor with an on-off ratio of larger than $10^3$ could be obtained.

It is possible to further increase the amount of zinc oxide to be added by performing the crystallization at much higher temperatures. However, in view of energy required for a high-temperature treatment, increasing the amount of zinc is not industrially preferable.

When the sputtering apparatus 2005, the materials or the like shown in this film-forming example are used, it is preferred that the crystallization treatment be conducted at 150° C. or more and 350° C. or less in an atmosphere containing oxygen and/or water, for example. Although not shown, in the case of the crystalline oxide 2021 in this film-forming example, the electron mobility logarithmically proportionally increases with an increase in electron carrier concentration. Further, it is preferable to conduct film formation in an atmosphere containing an oxygen and/or water while intentionally omitting the addition of impurity ions which serve to increase the electric resistivity.

Further, it is preferred that the crystalline oxide 2021 in this embodiment have resistance to PAN.

Due to the PAN resistance, the freedom of the production process can be enhanced, whereby the field-effect transistors 2001, 2001a and 2001b can be produced efficiently. In addition, since no damage is exerted on the source electrode 2022 and the drain electrode 2023 when these electrodes are etched with a PAN-based etching solution, reliability or the like is improved.

Here, the "having PAN resistance" means having an etching speed with a PAN-based etching solution of less than about 10 nm/min. Generally, as the PAN-based etching solution (an etching solution containing phosphoric acid, nitric acid and acetic acid), one which contains phosphoric acid of about 45 to 95 wt %, nitric acid of about 0.5 to 5 wt % and acetic acid of about 3 to 50 wt % is used.

PREPARATION EXAMPLE 2 OF A FIELD-EFFECT THIN FILM TRANSISTOR

Next, Preparation Example 2 of the field-effect thin film transistor 2001 using the above-mentioned crystalline oxide 2021 (see FIG. 10) will be explained.

By the technique mentioned above, the field-effect thin film transistor 2001 with a channel length of 50 μm and a channel width of 500 μm was prepared.

The field-effect thin film transistor 2001 in this preparation example had an on-off ratio of $10^5$ or more. The field-effect mobility was calculated from output characteristics. As a result, a field-effect mobility of about 7 cm²/V·sec was obtained in the saturation range. Further, the threshold voltage (Vth) was about +2.0V, meaning that the transistor had normally-off properties. The output properties showed a clear pinch-off. When a voltage of about 5V was applied between the source electrode 2022 and the drain electrode 2023 when no gate voltage was applied, it was possible to allow the current flown between the source electrode 2022 and the drain electrode 2023 to be about $10^{-7}$A.

The similar measurements were conducted after irradiating the thus-produced field-effect thin film transistor 2001 with visible rays. No variation in transistor properties was admitted. That is, in this embodiment, a thin film transistor which had a small electron carrier concentration, and hence, had a high electric resistivity and an active layer with a large electron mobility was realized.

(Evaluation of Characteristics of the Transistor)

Next, the current-voltage characteristics of the field-effect thin film transistor 2001 in this preparation example will be explained with reference to the drawing.

Figure 20:
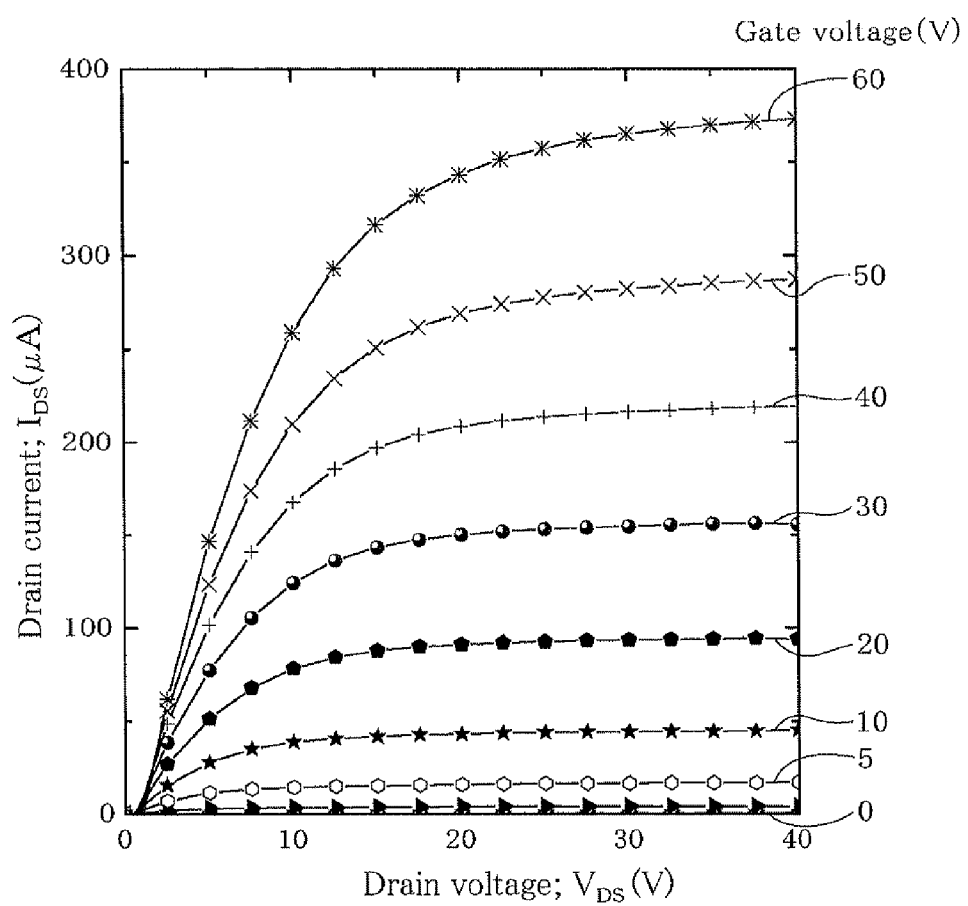
FIG. 20 is a graph of the current-voltage characteristics of the field-effect thin film transistor according to Production Example 2.

FIG. 20 is a graph of the current-voltage characteristics of the field-effect thin film transistor according to Production Example 2.

In FIG. 20, the current-voltage characteristics of the field-effect thin film transistor 2001 measured at room temperature are shown. From the fact that the drain current $I_{DS}$ increased with an increase in the gate voltage $V_{GS}$, it could be understood that the channel was an n-channel type semiconductor. This does not contradict the fact that the crystalline oxide indium-based semiconductor is an n-type semiconductor.

In addition, $I_{DS}$ showed typical behaviors as a semiconductor transistor; specifically it saturates (pinch-off) at around $V_{DS}$ of 10V. As a result of gain characteristics, the threshold value of a gate voltage $V_{GS}$ when 4V of $V_{DS}$ was applied was about 2.0 V. In addition, when $V_G$ was 10V, a current $I_{DS}$ of $10^{-5}$A was flown. This corresponds to the fact that carriers were induced by gate bias in the crystalline indium oxide semiconductor thin film in the insulating semiconductor.

In this preparation example, the field-effect thin film transistor 2001 was formed on the glass substrate 2010. Since the film formation itself can be performed at room temperature and the film can be then crystallized at low temperatures by the low temperature plasma crystallization method or the like, a substrate such as a plastic plate or film can be used. The crystalline oxide 2021 obtained in this preparation example absorbs almost no visible rays, and a transparent flexible TFT can be realized.

Hereinabove, the method for producing a field-effect transistor of the present invention is explained with reference to preferred embodiments. The configuration of the field-effect transistor of the present invention is not limited to the embodiments as mentioned above. It is needless to say various modifications are possible within the scope of the present invention.

For example, the method for producing a field-effect thin film transistor is not limited to the method for producing the above-mentioned bottom-gate or top-gate type field-effect thin film transistor, and can be applied to field-effect thin film transistors with various structures.

INDUSTRIAL APPLICABILITY

The field-effect transistor of the present invention can be used as a switching element of an LCD or an organic EL display. In addition, the field-effect transistor of the present invention can be widely used in flexible displays, as well as in IC cards or ID tags by forming a semiconductor thin film on a flexible material such as a plastic film.

The method for producing a field-effect transistor of the present invention can be used as a method for producing a switching element of an LCD or an organic EL display. In addition, the method for producing a field-effect transistor of the present invention can be widely used in flexible displays as well as in IC cards or ID tags by forming a semiconductor thin film on a flexible material such as a plastic film.

The invention claimed is:

1. A field-effect transistor comprising a gate electrode, an active layer, a source electrode and a drain electrode, wherein a crystalline oxide containing indium and having an electron carrier concentration of less than $10^{18}/cm^3$ is used as the active layer, and the gate electrode is in self-alignment with the source electrode and the drain electrode, and the crystalline oxide has a bixbite structure and is polycrystalline.

2. The field-effect transistor according to claim 1, wherein the crystalline oxide further contains a positive divalent element.

3. The field-effect transistor according to claim 2, wherein the positive divalent element is at least one element of Zn, Mg, Ni, Co and Cu.

4. The field-effect transistor according to claim 2, wherein the electron mobility of the crystalline oxide logarithmically proportionally increases in a certain range with an increase in the electron carrier concentration, when the atomic ratio ([M2]/[A]) of the number of the atoms of the positive divalent element ([M2]) to the number of the atoms of all metal elements contained in the crystalline oxide ([A]) changes.

5. The field-effect transistor according to claim 1, wherein the crystalline oxide further contains a positive trivalent element different from indium.

6. The field-effect transistor according to claim 5, wherein the positive trivalent element is at least one element of B, Al, Ga, Sc, Y and a lanthanoid element.

7. The field-effect transistor according to claim 5, wherein the electron mobility of the crystalline oxide logarithmically proportionally increases in a certain range with an increase in electron carrier concentration, when the atomic ratio ([M3]/[A]) of the atom number of the positive trivalent element ([M3]) to the atom number of all metal elements contained in the crystalline oxide ([A]) changes.

8. The field-effect transistor according to claim 1, wherein the crystalline oxide is a nondegenerate semiconductor.

9. The field-effect transistor according to claim 1, wherein the crystalline oxide has a PAN resistance.

10. The field-effect transistor according to claim 1, wherein the field-effect transistor is a top-gate type transistor and the gate electrode is formed using the pattern of the source electrode and the drain electrode formed on a transparent substrate as a mask.

11. The field-effect transistor according to claim 1, wherein the field-effect transistor is a bottom-gate type transistor and the source electrode and the drain electrode are formed using the pattern of the gate electrode formed on a transparent substrate as a mask.

12. A method for producing a field-effect transistor according to claim 1, using a crystalline indium-containing oxide with an electron carrier concentration of less than $10^{18}/cm^3$ as an active layer and having a bixbite structure and polycrystalline structure, comprising, the active layer forming step of forming the crystalline oxide in an atmosphere containing oxygen and/or water.

13. The method for producing a field-effect transistor according to claim 12, wherein the atmosphere containing oxygen and/or water contains at least one of molecular oxygen, ozone gas, nitrogen oxide gas, oxygen-containing radicals, atomic oxygen, oxygen ions, oxygen radicals, water vapor and hydroxide ions.

14. The method for producing a field-effect transistor according to claim 12, wherein the film-forming temperature of the crystalline oxide is 150° C. or more and 350° C. or less.

15. The method for producing a field-effect transistor according to claim 12, wherein a sputtering method is used in the active layer forming step.

16. A method for producing a field-effect transistor according to claim 1, using a crystalline indium-containing oxide with an electron carrier concentration of less than $10^{18}/cm^3$ as an active layer and having a bixbite structure and polycrystalline structure, comprising, the thin film-forming step of forming an amorphous oxide film for the active layer, and the crystallizing step of crystallizing the amorphous oxide to the crystalline oxide.

17. The method for producing a field-effect transistor according to claim 16, wherein the crystallizing step uses heating and/or irradiation of an oxygen-containing plasma.

18. The method for producing a field-effect transistor according to claim 16, wherein the crystallizing step uses heating and the temperature thereof is 150° C. or more and 350° C. or less.

19. The method for producing a field-effect transistor according to claim 16, wherein at least one of the thin film-forming step and the crystallizing step is conducted in an atmosphere containing oxygen and/or water, and the atmosphere containing oxygen and/or water contains at least one of molecular oxygen, ozone gas, nitrogen oxide gas, oxygen-containing radicals, atomic oxygen, oxygen ions, oxygen radicals, water vapor and hydroxide ions.

20. The method for producing a field-effect transistor according to claim 16, wherein a sputtering method is used in the thin film-forming step.

21. The method for producing a field-effect transistor according to claim 12, wherein the crystalline oxide contains a positive divalent element.

22. The method for producing a field-effect transistor according to claim 21, wherein the positive divalent element is at least one element of Zn, Mg, Ni, Co and Cu.

23. The method for producing a field-effect transistor according to claim 21, wherein the electron mobility of the crystalline oxide logarithmically proportionally increases in a certain range with an increase in the electron carrier concentration, when the atomic ratio ([M2]/[A]) of the number of the atoms of the positive divalent element ([M2]) to the number of the atoms of all metal elements contained in the crystalline oxide ([A]) changes.

24. The method for producing a field-effect transistor according to claim 12, wherein the crystalline oxide contains a positive trivalent element different from indium.

25. The method for producing a field-effect transistor according to claim 24, wherein the positive trivalent element is at least one element of B, Al, Ga, Sc, Y and a lanthanoid element.

26. The method for producing a field-effect transistor according to claim 24, wherein the electron mobility of the crystalline oxide logarithmically proportionally increases in a certain range with an increase in the electron carrier concentration, when the atomic ratio ([M3]/[A]) of the number of the atoms of the positive trivalent element ([M3]) to the number of the atoms of all metal elements contained in the crystalline oxide ([A]) changes.

27. The method for producing a field-effect transistor according to claim 12, wherein a substrate on which the active layer is to be formed is subjected to at least one treatment of ultraviolet irradiation in an ozone atmosphere, plasma irradiation and cleaning with a cleaning solution containg hydrogen peroxide.

28. The method for producing a field-effect transistor according to claim 12, wherein the crystalline oxide is a nondegenerate semiconductor.

29. The method for producing a field-effect transistor according to claim 12, wherein the crystalline oxide has a PAN resistance.

30. The method for producing a field-effect transistor according to claim 16, wherein the crystalline oxide contains a positive divalent element.

31. The method for producing a field-effect transistor according to claim 30, wherein the positive divalent element is at least one element of Zn, Mg, Ni, Co and Cu.

32. The method for producing a field-effect transistor according to claim 30, wherein the electron mobility of the crystalline oxide logarithmically proportionally increases in a certain range with an increase in the electron carrier concentration, when the atomic ratio ([M2]/[A]) of the number of the atoms of the positive divalent element ([M2]) to the number of the atoms of all metal elements contained in the crystalline oxide ([A]) changes.

33. The method for producing a field-effect transistor according to claim 16, wherein the crystalline oxide contains a positive trivalent element different from indium.

34. The method for producing a field-effect transistor according to claim 33, wherein the positive trivalent element is at least one element of B, Al, Ga, Sc, Y and a lanthanoid element.

35. The method for producing a field-effect transistor according to claim 33, wherein the electron mobility of the crystalline oxide logarithmically proportionally increases in a certain range with an increase in the electron carrier concentration, when the atomic ratio ([M3]/[A]) of the number of the atoms of the positive trivalent element ([M3]) to the number of the atoms of all metal elements contained in the crystalline oxide ([A]) changes.

36. The method for producing a field-effect transistor according to claim 16, wherein a substrate on which the active layer is to be formed is subjected to at least one treatment of ultraviolet irradiation in an ozone atmosphere, plasma irradiation and cleaning with a cleaning solution containg hydrogen peroxide.

37. The method for producing a field-effect transistor according to claim 16, wherein the crystalline oxide is a nondegenerate semiconductor.

38. The method for producing a field-effect transistor according to claim 16, wherein the crystalline oxide has a PAN resistance.

39. The field effect transistor according to claim 5, wherein the positive trivalent element is at least one of B or a lanthanoid element.

* * * * *